(12) United States Patent
Sieg et al.

(10) Patent No.: US 11,257,681 B2
(45) Date of Patent: Feb. 22, 2022

(54) USING A SAME MASK FOR DIRECT PRINT AND SELF-ALIGNED DOUBLE PATTERNING OF NANOSHEETS

(71) Applicant: International Business Machines Corporation, Armonk, NY (US)

(72) Inventors: Stuart Sieg, Albany, NY (US); Daniel James Dechene, Watervliet, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/514,235

(22) Filed: Jul. 17, 2019

(65) Prior Publication Data

US 2021/0020446 A1    Jan. 21, 2021

(51) Int. Cl.
*H01L 21/308* (2006.01)
*H01L 21/8234* (2006.01)
(Continued)

(52) U.S. Cl.
CPC ...... *H01L 21/3086* (2013.01); *H01L 21/0337* (2013.01); *H01L 21/823431* (2013.01);
(Continued)

(58) Field of Classification Search
CPC ............. H01L 21/02019; H01L 21/027; H01L 21/033; H01L 21/0332; H01L 21/0335; H01L 21/0337; H01L 21/3086; H01L 21/823431; H01L 29/0649; H01L 29/0673; H01L 29/165; H01L 29/401; H01L 29/42392; H01L 29/66439; H01L 29/66545; H01L 29/66795; H01L 29/775; H01L 29/78696; H01L 29/0665
See application file for complete search history.

(56) References Cited

U.S. PATENT DOCUMENTS 8,216,902 B2   7/2012  Chang et al.
8,735,296 B2 *  5/2014  Jung ................... H01L 21/3086
                                            438/703
(Continued)

FOREIGN PATENT DOCUMENTS

CN         108695230 A    10/2018
WO  PCT/IB2020/056290    10/2020

*Primary Examiner* — Maliheh Malek
(74) *Attorney, Agent, or Firm* — Abdy Raissinia; Ryan, Mason & Lewis, LLP

(57) ABSTRACT

A method of forming a semiconductor structure includes forming a nanosheet stack including alternating layers of a sacrificial material and a channel material over a substrate, the layers of channel material providing nanosheet channels for one or more nanosheet field-effect transistors. The method also includes forming a hard mask stack over the nanosheet stack, and forming a patterning layer over the hard mask stack. The method further includes patterning a lithographic mask over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using self-aligned double patterning. The second width is less than the first width.

20 Claims, 23 Drawing Sheets

(51) Int. Cl.
*H01L 21/033* (2006.01)
*H01L 29/06* (2006.01)
*H01L 29/40* (2006.01)
*H01L 29/66* (2006.01)
*H01L 27/092* (2006.01)

(52) U.S. Cl.
CPC ...... *H01L 27/0924* (2013.01); *H01L 29/0665* (2013.01); *H01L 29/401* (2013.01); *H01L 29/66545* (2013.01)

(56) References Cited

U.S. PATENT DOCUMENTS

| | | | |
|---|---|---|---|
| 9,166,023 B2 | 10/2015 | Loubet et al. | |
| 9,202,920 B1 | 12/2015 | Liu et al. | |
| 9,287,135 B1 | 3/2016 | Doris et al. | |
| 9,472,506 B2 | 10/2016 | Conklin et al. | |
| 9,490,335 B1 | 11/2016 | Doris et al. | |
| 9,722,022 B2 | 8/2017 | Leobandung et al. | |
| 9,852,916 B2* | 12/2017 | Chen | H01L 21/67207 |
| 9,871,099 B2 | 1/2018 | Pranatharthiharan et al. | |
| 9,923,055 B1* | 3/2018 | Cheng | H01L 29/42392 |
| 10,002,939 B1 | 6/2018 | Cheng et al. | |
| 10,014,389 B2* | 7/2018 | Xie | H01L 29/165 |
| 10,043,900 B1* | 8/2018 | Bi | H01L 29/785 |
| 10,069,015 B2 | 9/2018 | Cheng et al. | |
| 10,304,744 B1* | 5/2019 | Joseph | H01L 21/3086 |
| 10,361,129 B1* | 7/2019 | Sieg | H01L 27/088 |
| 10,504,914 B2* | 12/2019 | Wang | H01L 27/1157 |
| 10,566,445 B2* | 2/2020 | Bi | H01L 29/66439 |
| 10,707,208 B2* | 7/2020 | Cheng | H01L 29/1083 |
| 2013/0143372 A1* | 6/2013 | Kim | H01L 27/0886 438/163 |
| 2014/0187047 A1* | 7/2014 | Tagami | H01L 21/31144 438/703 |
| 2016/0020109 A1* | 1/2016 | Yoo | H01L 29/66553 438/275 |
| 2017/0117382 A1* | 4/2017 | Cheng | H01L 29/1083 |
| 2017/0294308 A1* | 10/2017 | Zang | H01L 21/0337 |
| 2017/0372973 A1* | 12/2017 | Bi | H01L 21/0332 |
| 2018/0033871 A1* | 2/2018 | Xie | H01L 29/66545 |
| 2018/0076035 A1* | 3/2018 | Bergendahl | H01L 21/0337 |
| 2018/0096846 A1* | 4/2018 | Arnold | H01L 21/31 |
| 2018/0197999 A1* | 7/2018 | Palacios | H01L 29/0673 |
| 2018/0277481 A1 | 9/2018 | Cheng et al. | |
| 2018/0315601 A1* | 11/2018 | Peng | H01L 21/0276 |
| 2019/0067112 A1* | 2/2019 | Liang | H01L 21/823412 |
| 2019/0206725 A1* | 7/2019 | Chu | H01L 21/7688 |
| 2019/0326286 A1* | 10/2019 | Xie | H01L 29/0665 |
| 2019/0371678 A1* | 12/2019 | Song | H01L 21/31053 |
| 2020/0066520 A1* | 2/2020 | Arnold | G03F 7/0002 |
| 2020/0274000 A1* | 8/2020 | Xie | H01L 29/6681 |
| 2020/0365467 A1* | 11/2020 | Cheng | H01L 29/0673 |
| 2020/0381530 A1* | 12/2020 | Chung | H01L 21/823431 |
| 2021/0013321 A1* | 1/2021 | Yogendra | H01L 29/0847 |
| 2021/0134949 A1* | 5/2021 | Xie | H01L 29/6681 |
| 2021/0151565 A1* | 5/2021 | Xie | H01L 29/66545 |
| 2021/0151601 A1* | 5/2021 | Miao | H01L 21/823437 |
| 2021/0305361 A1* | 9/2021 | Pranatharthi Haran | H01L 29/0649 |
| 2021/0320186 A1* | 10/2021 | Xie | H01L 29/785 |
| 2021/0336038 A1* | 10/2021 | Zhang | H01L 29/785 |

* cited by examiner

1200

1300

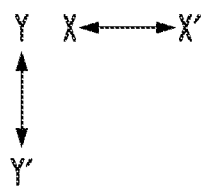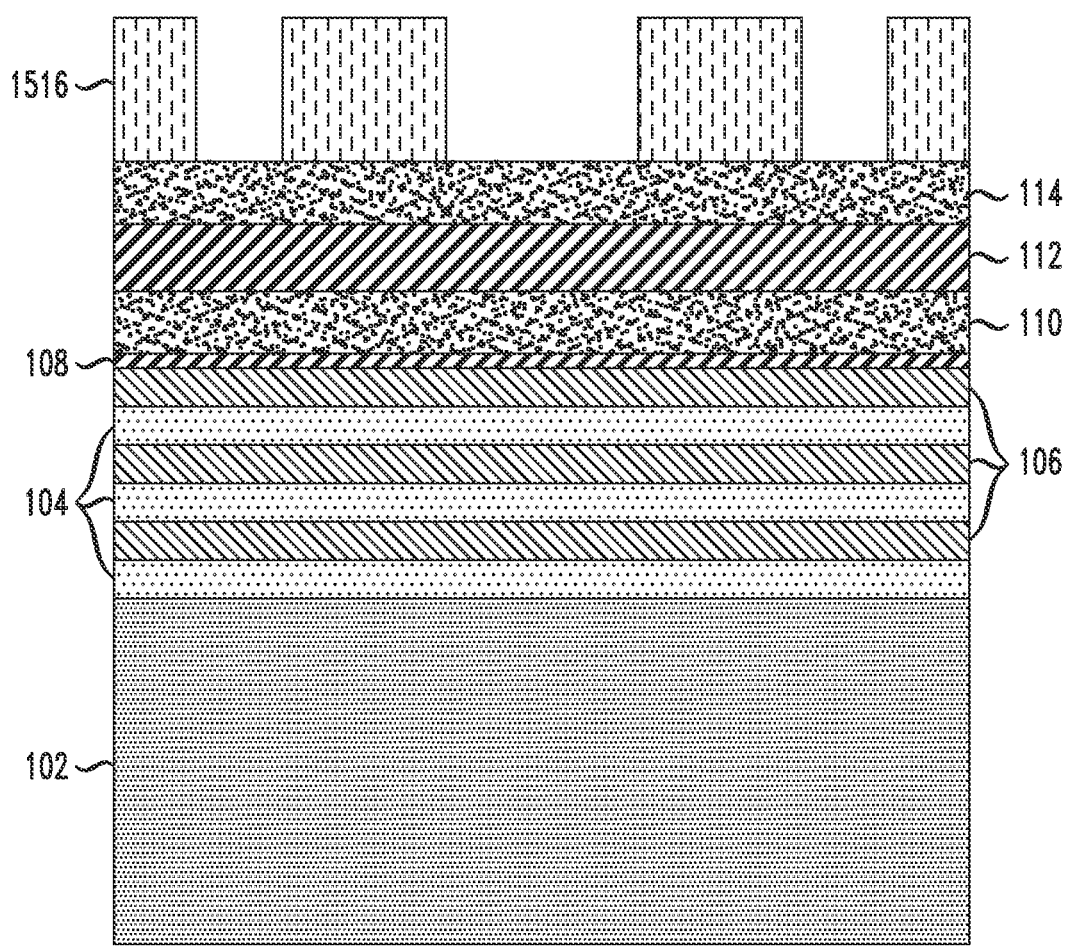
FIG. 16
1600

2200

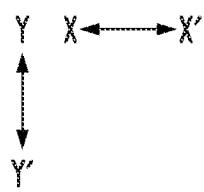
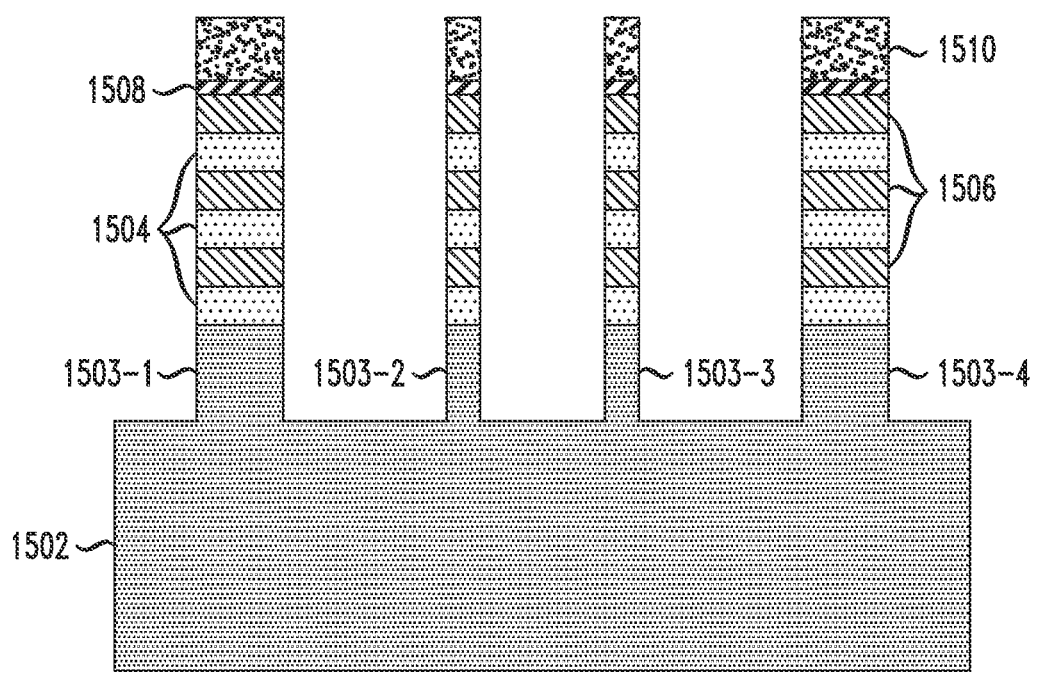
FIG. 23
2300

USING A SAME MASK FOR DIRECT PRINT AND SELF-ALIGNED DOUBLE PATTERNING OF NANOSHEETS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field effect transistors (FETs), and capacitors.

SUMMARY

Embodiments of the invention provide techniques for forming both direct print and self-aligned double patterning nanosheets using a same mask.

In one embodiment, a method of forming a semiconductor structure comprises forming a nanosheet stack comprising alternating layers of a sacrificial material and a channel material over a substrate, the layers of channel material providing nanosheet channels for one or more nanosheet field-effect transistors. The method also comprises forming a hard mask stack over the nanosheet stack, and forming a patterning layer over the hard mask stack. The method further comprises patterning a lithographic mask over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using self-aligned double patterning. The second width is less than the first width.

In another embodiment, a method of forming a semiconductor structure comprises forming a nanosheet stack comprising alternating layers of a sacrificial material and a channel material over a substrate, the layers of channel material providing nanosheet channels for one or more nanosheet field-effect transistors. The method also comprises forming a hard mask stack over the nanosheet stack, and forming a patterning layer over the hard mask stack. The method further comprises patterning a lithographic mask over the patterning layer, the lithographic mask covering (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using self-aligned double patterning. The second width is less than the first width.

In another embodiment, a method of forming a semiconductor structure comprises forming a nanosheet stack comprising alternating layers of a sacrificial material and a channel material over a substrate, the layers of channel material providing nanosheet channels for one or more nanosheet field-effect transistors. The method also comprises forming a hard mask stack over the nanosheet stack, and forming a patterning layer over the hard mask stack. The method further comprises patterning a lithographic mask over the patterning layer, the lithographic mask exposing (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using self-aligned double patterning. The second width is less than the first width.

In another embodiment, a semiconductor structure comprises a substrate and a nanosheet stack disposed over the substrate, the nanosheet stack comprising alternating layers of a sacrificial material and a channel material, the layers of channel material providing nanosheet channels for one or more nanosheet field-effect transistors. The semiconductor structure also comprises a hard mask stack disposed over the nanosheet stack, and a patterning layer disposed over the hard mask stack. The semiconductor structure further comprises a lithographic mask disposed over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using self-aligned double patterning. The second width is less than the first width.

BRIEF DESCRIPTION OF THE DRAWINGS

FIG. 16 depicts a side cross-sectional view of the FIG. 15 structure following removal of exposed portions of the patterning layer and removal of the lithographic mask, according to an embodiment of the invention.

FIG. 23 depicts a side cross-sectional view of the FIG. 22 structure following etching of exposed portions of the nanosheet stack and a portion of the substrate, according to an embodiment of the invention.

DETAILED DESCRIPTION

Figure 1:
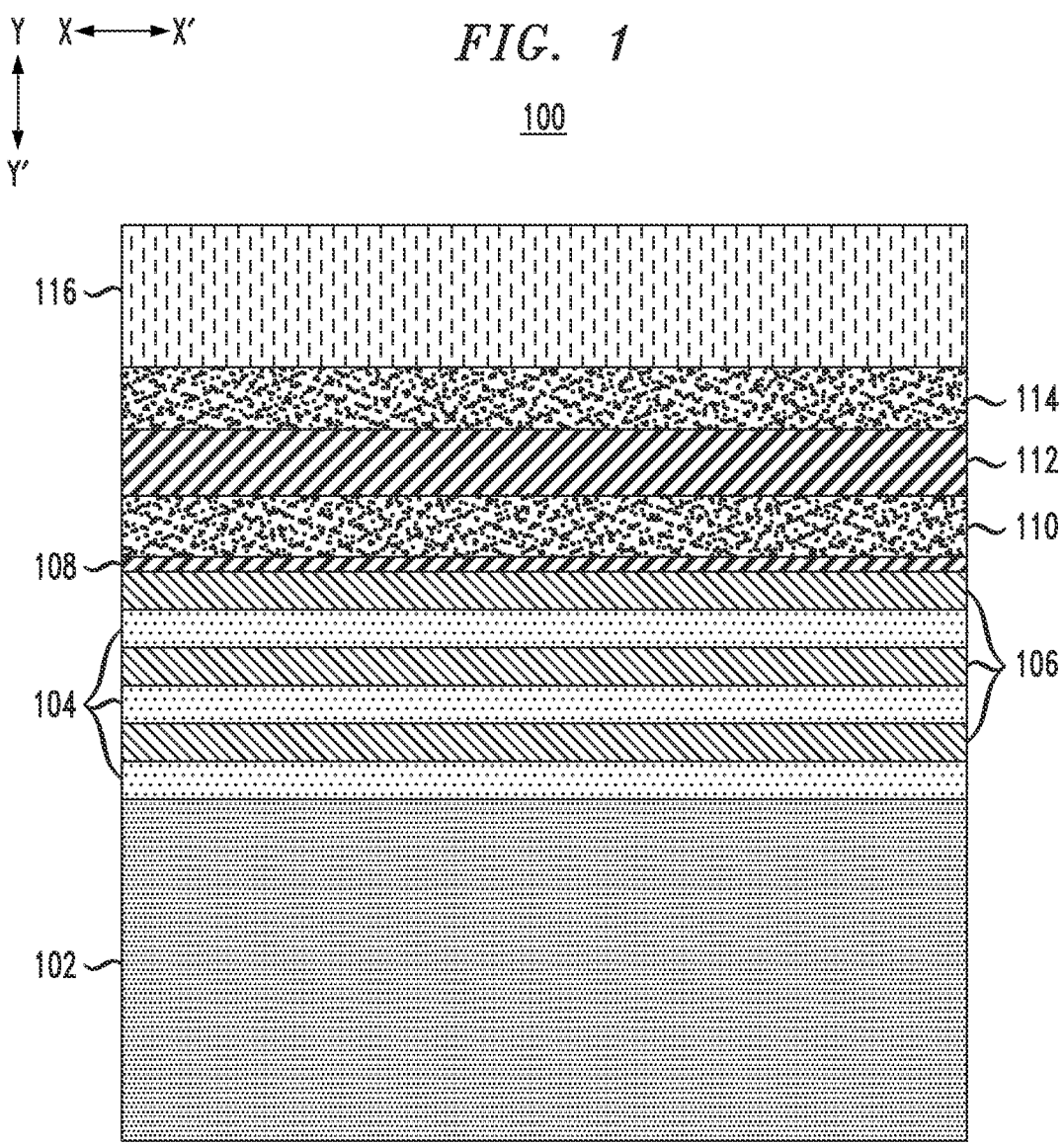
FIG. 1 depicts a side cross-sectional view of a semiconductor layer stack, according to an embodiment of the invention.

Illustrative embodiments of the invention may be described herein in the context of illustrative methods for forming both direct print and self-aligned double patterning nanosheets using a same mask. However, it is to be understood that embodiments of the invention are not limited to the illustrative methods, apparatus, systems and devices but instead are more broadly applicable to other suitable methods, apparatus, systems and devices.

A FET is a transistor having a source, a gate, and a drain, and having action that depends on the flow of majority carriers along a channel that runs past the gate between the source and drain. Current through the channel between the source and drain may be controlled by a transverse electric field under the gate. The length of the gate determines how fast the FET switches, and can be about the same as the length of the channel (such as the distance between the source and drain).

In some FETs, more than one gate or multi-gate arrangements may be used for controlling the channel. Multi-gate FETs are promising candidates to scale down complementary metal-oxide-semiconductor (CMOS) FET technology. However, the smaller dimensions associated with multi-gate FETs (as compared to single-gate FETs) necessitate greater control over performance issues such as short channel effects, punch-through, metal-oxide semiconductor (MOS) leakage current, and the parasitic resistance that is present in a multi-gate FET.

Various techniques may be used to reduce the size of FETs, One technique is through the use of fin-shaped channels in FinFET devices. Before the advent of FinFET arrangements, CMOS devices were typically substantially planar along the surface of the semiconductor substrate, with the exception of the PET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

Another technique useful for reducing the size of FETs is through the use of stacked nanosheet channels formed over a semiconductor substrate. Stacked nanosheets may be two-dimensional nanostructures, such as sheets having a thickness range on the order of 1 to 100 nanometers (nm). Nanosheets and nanowires are viable options for scaling to 7 nm and beyond. A general process flow for formation of a nanosheet stack involves removing sacrificial layers, which may be formed of silicon germanium (SiGe), between sheets of channel material, which may be formed of silicon (Si).

Process options for nanosheet printing may rely on a direct print with a single mask, or a direct print and self-aligned double patterning (SADP) with two mask processing solutions. For small nanosheet widths used in some devices (e.g., such as static random-access memory (SRAM) structures), the variability that is created with a direct print process may not be sufficient for device operation. As an example, as dimensions approach fin width, SADP may be needed. Nanosheet stacks, however, provide various advantages in enabling the use of varying device widths. Multiple mask solutions (e.g., for direct print and SADP) are problematic, as the multiple masks result in overlay (OL) degradation. Such OL degradation may be due in part to split levels that cause downstream impacts (e.g., in parasitic capacitance) for various device features (e.g., gate and source/drain overlays, etc.).

As noted above, some device structures such as SRAM structures benefit from varying nanosheet widths. SRAM is a type of memory device that offers high speed, low power consumption and simple operation. Unlike dynamic random-access memory (DRAM), SRAM does not need to regularly refresh stored data and has a straightforward design. SRAM cells may be formed using varying numbers of transistors.

The six transistor (6T) SRAM cell is widely used as a primary memory in microprocessor circuits. A 6T SRAM cell may include a first n-type FET device (nFET) connected to a first bit line node (BL), a first output node (Q), and a word line node (WL). A second nFET device of the 6T SRAM cell is connected to the Q node, a ground node (e.g., VSS), and a second output node (Q'). A first p-type FET device (pFET) is connected to the Q node, the Q' node, and a voltage source or supply node (e.g., VDD). A second OTT device is connected to the VDD node, the Q node and the Q' node. A third nFET device is connected to the VSS node, the Q node, and the Q' node. A fourth nFET device is connected to a second bit line node (BLB), the WL node and the Q' node. The first and fourth nFET devices are pass-gate (PG)

transistors of the 6T SRAM cell, the second and third nFET devices are the pull-down (PD) transistors of the 6T SRAM cell, and the first and second pFET devices are the pull-up (PU) transistors of the 6T SRAM cell.

In a 6T SRAM cell formed using nanosheet transistors, it may be desired to use different nanosheet widths for the various nFET and pFET devices in the cell. For example, nanosheet widths may be larger for nFET devices of the 6T SRAM cell than for the pFET devices of the 6T SRAM cell. It should be appreciated, however, that this is not a requirement and that embodiments are not limited to forming smaller nanosheet widths for pFET than nFET devices. Further, the techniques described herein are not limited to use with forming SRAM structures, but instead are more generally applicable for forming nanosheet FETs where different nanosheet widths are desired.

Illustrative processes for forming nanosheets of different widths using both direct print and SADP using a same mask will now be described in further detail with respect to FIGS. 1-23.

FIG. 1 shows a side cross-sectional view 100 of a semiconductor layer stack, including a substrate 102, a nanosheet stack including alternating layers 104 and 106 of a sacrificial material and a channel material, a padding layer 108, hard mask layers 110, 112 and 114, and a patterning layer 116.

The substrate 102 may be a semiconductor structure formed of bulk silicon (Si), although other suitable materials may be used, such as various silicon-containing materials. Illustrative examples of silicon-containing materials suitable for the substrate 102 include, but are not limited to, Si, silicon germanium (SiGe), silicon germanium carbide (SiGeC), silicon carbide (SiC), polysilicon, epitaxial silicon, amorphous silicon, and multi-layers thereof. Although silicon is the predominantly used semiconductor material in wafer fabrication, alternative semiconductor materials can be employed, such as, but not limited to, germanium (Ge), gallium arsenide (GaAs), gallium nitride (GaN), cadmium telluride (CdTe) and zinc selenide (ZnSe). In an alternate embodiment, the substrate 102 may be silicon-on-insulator (SOI) wafer. As is known in the art, a SOI wafer includes a SOI layer separated from a substrate by a buried insulator. Suitable substrate materials include, but are not limited to, Si, strained Si, silicon carbide (SiC), Ge, SiGe, SiGeC, Si alloys, Ge alloys, GaAs, indium arsenide (InAs), indium phosphide (InP), or any combination thereof. Suitable dielectric materials for the buried insulator include, but are not limited to, an oxide material such as silicon dioxide ($SiO_2$). When the buried insulator is an oxide, the buried insulator may also be referred to as a buried oxide or BOX.

The substrate 102 may have a width or horizontal thickness (in direction X-X') that varies as desired (e.g., based on the number of device structures to be formed). The substrate 102 may have a height or vertical thickness (in direction Y-Y') ranging from 300 micrometers (μm) to 1000 μm.

Nanosheet stacks including the alternating layers of a sacrificial material 104 and a channel material 106 are formed over the substrate 102. While FIG. 1 shows an example where there are three sacrificial layers 104 and three channel layers 106 in the nanosheet stack, it should be appreciated that nanosheet stacks may include more or fewer than three sets of alternating layers of the sacrificial material and the channel material.

The sacrificial layers 104 may be formed of any suitable material that may be etched selective to the channel material 106. If the channel layers 106 are Si, the sacrificial layers 104 may be SiGe. If the channel layers 106 are indium gallium arsenide (InGaAs), the sacrificial layers 104 may be indium aluminum arsenide (InAlAs). Various other combinations of III-V materials may be used. The material of the sacrificial layers 104 is one that can be removed selective to the material of the channel layers 106. The sacrificial layers 104 and channel layers 106 may each have a thickness in the range of 4 nm to 15 nm. The nanosheet stack of sacrificial layers 104 and channel layers 106 may be epitaxially grown over the substrate 102.

The padding layer 108 is formed over the nanosheet stack as illustrated (e.g., such as using chemical vapor deposition (CVD), physical vapor deposition (PVD) or another suitable oxide deposition process). The padding layer 108 may be formed of an oxide such as silicon dioxide ($SiO_2$). The padding layer 108 may have a height or vertical thickness (in direction Y-Y') in the range of 1 nm to 10 nm.

Hard mask layers 110, 112 and 114 are formed over the padding layer 108. In some embodiments, the hard mask layers 110 and 114 are a nitride material such as silicon nitride (SiN) while the hard mask layer 112 is an oxide material such as $SiO_2$. In such cases, the hard mask layers 110, 112 and 114 collectively provide a nitride-oxide-nitride (NON) hard mask. The hard mask layers 110, 112 and 114 may be formed using high density plasma (HDP) CVD (HDPCVD), plasma-enhanced CVD (PECVD), CVD, etc. The hard mask layer 110 may have a height or vertical thickness (in direction Y-Y') in the range of 10 nm to 50 nm. The hard mask layer 112 may have a height or vertical thickness (in direction Y-Y') in the range of 10 nm to 50 nm. The hard mask layer 114 may have a height or vertical thickness (in direction Y-Y') in the range of 10 nm to 50 nm.

The patterning layer 116 is formed over the hard mask layer 114. The patterning layer 116 may be formed of amorphous silicon (a-Si) or another suitable material such as amorphous carbon (a-C). The patterning layer 116 may be formed using any suitable deposition process, such as CVD, PVD, etc. The patterning layer 116 may have a height or vertical thickness (in direction Y-Y') in the range of 10 nm to 200 nm.

Figure 2:
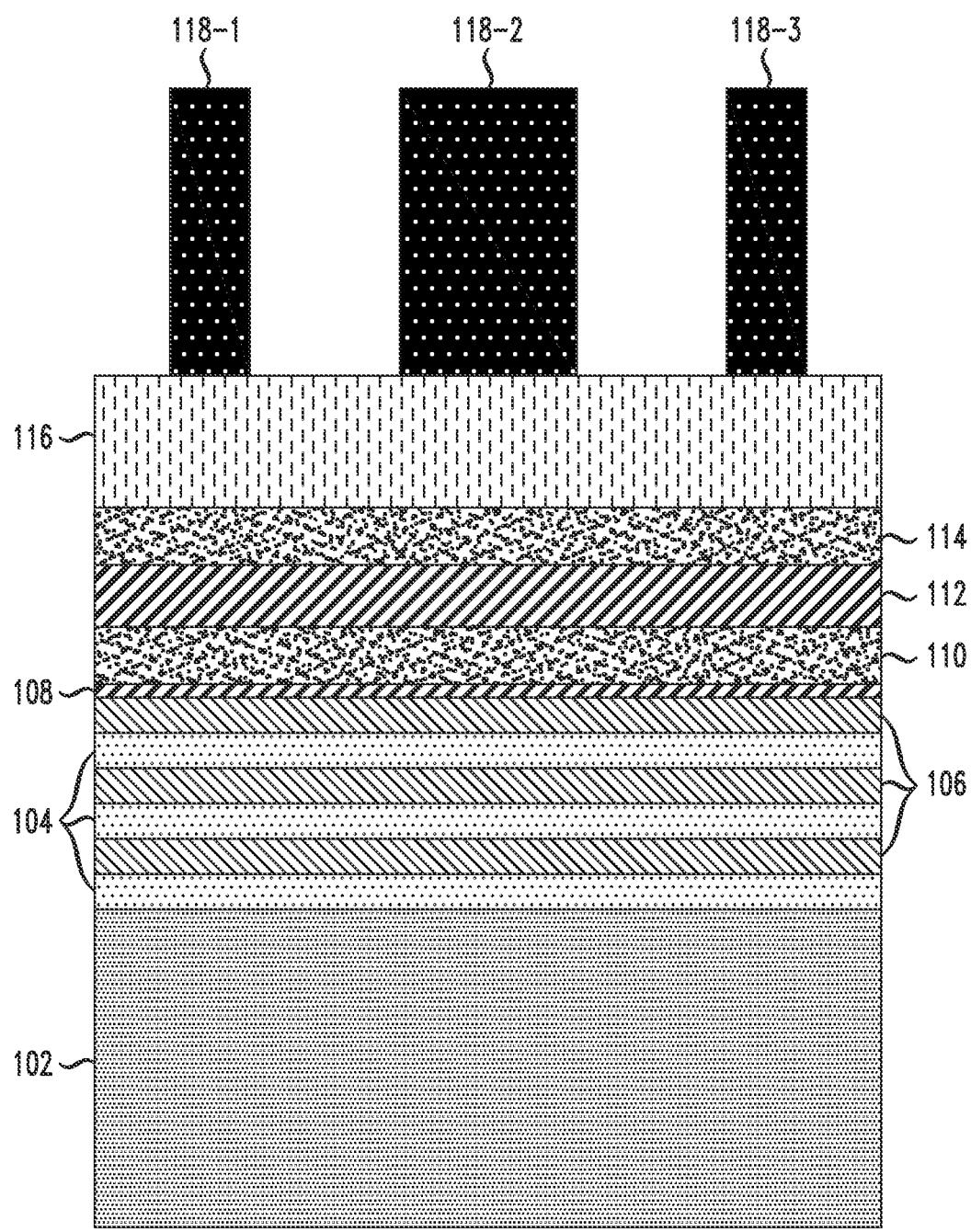
FIG. 2 depicts a side cross-sectional view of the FIG. 1 structure following patterning of a lithographic mask, according to an embodiment of the invention.

FIG. 2 shows a side cross-sectional view 200 of the FIG. 1 structure followed by lithography and etching to form a lithographic mask with portions 118-1, 118-2 and 118-3 (collectively, lithographic mask 118) over the patterning layer 116 as illustrated. The lithographic mask 118 may be formed of photoresist. The lithographic mask 118 may have a height or vertical thickness (in direction Y-Y') in the range of 20 nm to 1000 nm.

The width or horizontal thickness (in direction X-X') of the lithographic mask portions 118-1 and 118-3 may be in the range of 5 nm to 2000 nm. The lithographic mask portions 118-1 and 118-3 provide direct print control of the width of nanosheets for underlying device structures after the processing described below. For example, the lithographic mask portions 118-1 and 118-3 may be used to control the device width for underlying n-type FETs (nFETs) formed from the underlying nanosheet stack.

The width or horizontal thickness (in direction X-X') of the lithographic mask portion 118-2 may be in the range of 5 nm to 200 nm. The lithographic mask portion 118-2 provides SADP control of the width of nanosheets for underlying device structures after the processing described below. For example, the lithographic mask portion 118-2 may be used to control the device width for underlying p-type FETs (pFETs) formed from the underlying nanosheet stack.

As will be described in further detail below, the number and sizing of the portions of the lithographic mask 118 in FIG. 2 is used to form a particular arrangement of nanosheet FETs from the underlying nanosheet stack (e.g., a pair of nFET devices using direct print with the lithographic mask portions 118-1 and 118-3, and a pair of pFET devices using SADP with the lithographic mask portion 118-2). It should be appreciated that various other combinations of varying width nanosheet FETs may be formed using different numbers and sizes of mask layers.

Figure 3:
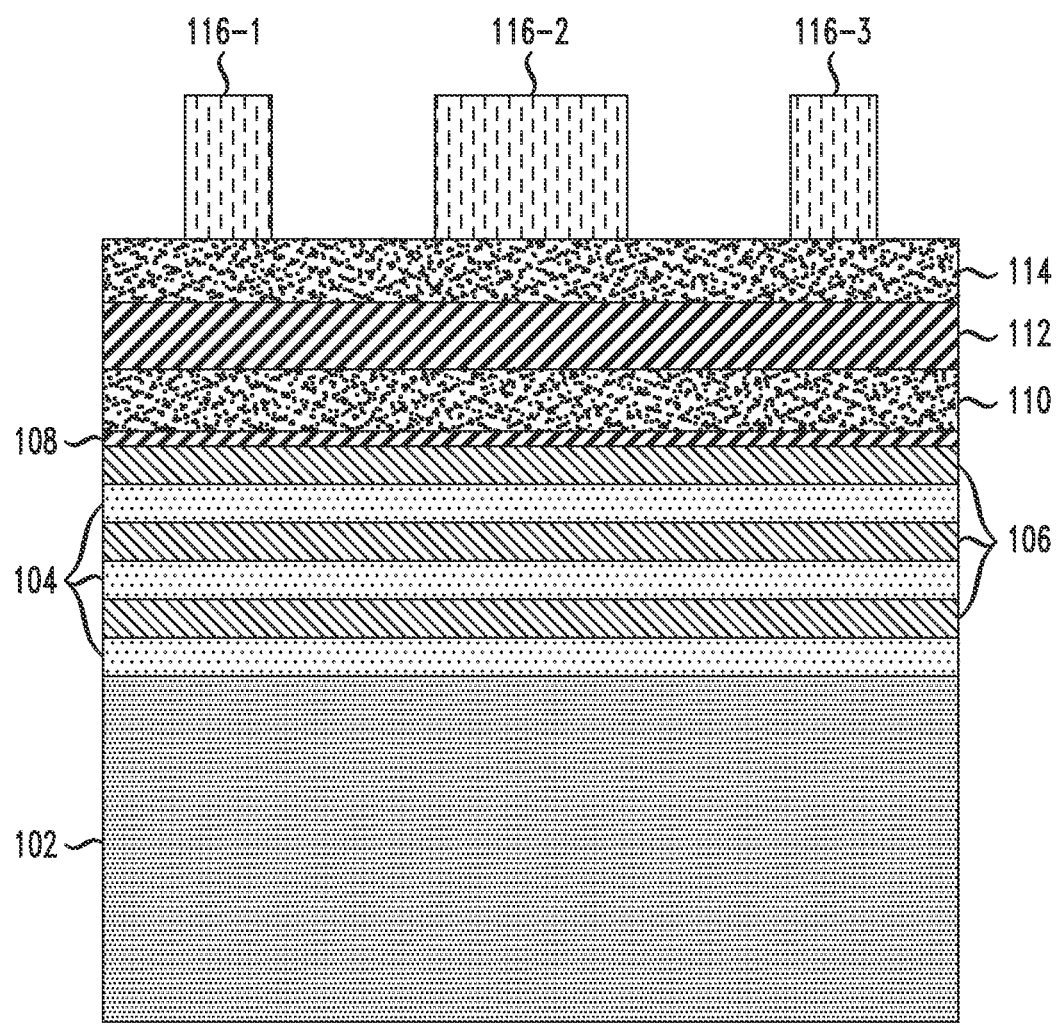
FIG. 3 depicts a side cross-sectional view of the FIG. 2 structure following etching of exposed portions of the patterning layer and removal of the lithographic mask, according to an embodiment of the invention.

FIG. 3 shows a side cross-sectional view 300 of the FIG. 2 structure following etching portions of the patterning layer 116 that are exposed by the lithographic mask 118 (e.g., using a-Si reactive-ion etching (RIE)). The lithographic mask 118 is then removed. As a result, mandrels 116-1, 116-2 and 116-3 of the patterning layer 116 remain.

Figure 4:
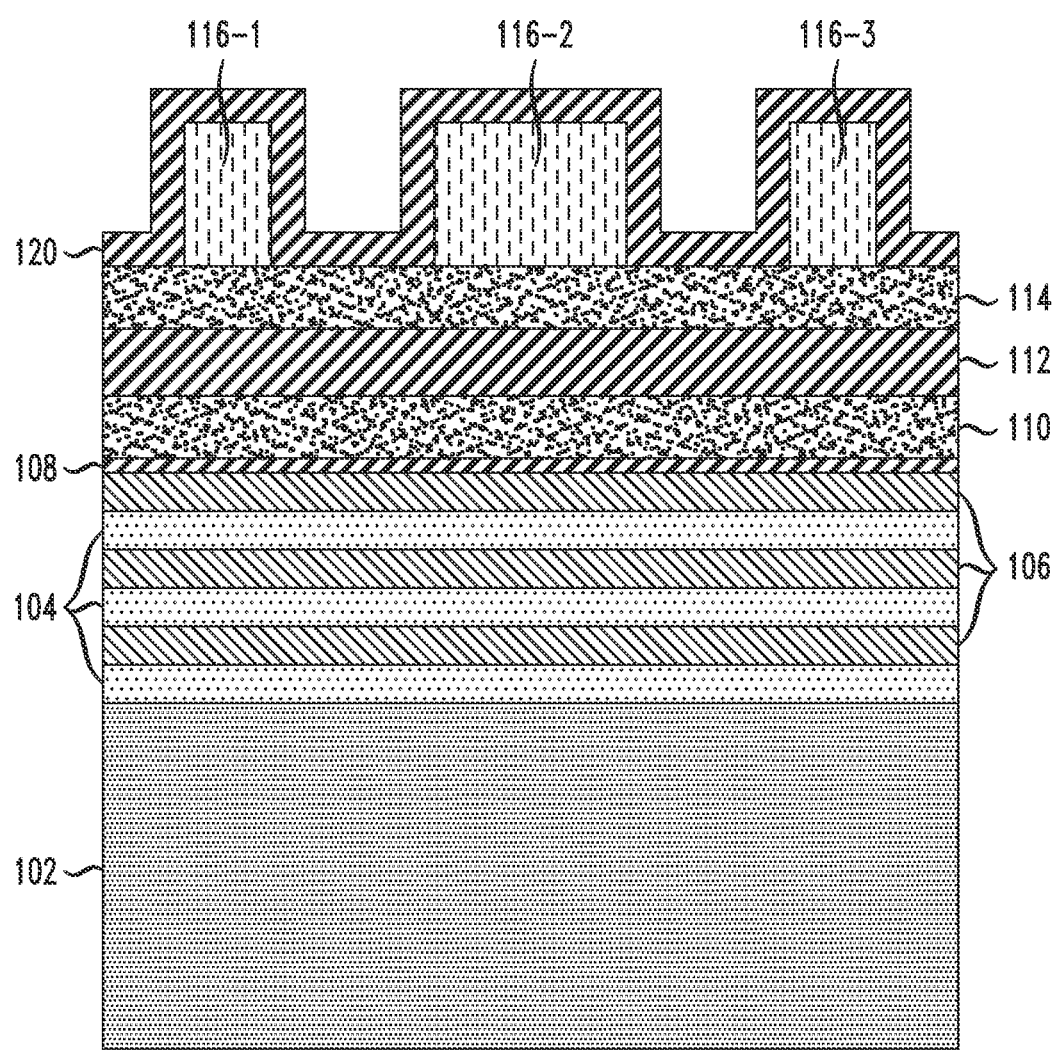
FIG. 4 depicts a side cross-sectional view of the FIG. 3 structure following formation of a spacer material, according to an embodiment of the invention.

FIG. 4 shows a side cross-sectional view 400 of the FIG. 3 structure following formation of a spacer material 120. The spacer material 120 may be formed using atomic layer deposition (ALD) or another suitable process. The spacer material 120 may be formed of an oxide, such as a metal oxide, $SiO_2$, etc. The spacer material 120 may have a uniform thickness in the range of 5 nm to 60 nm. The spacer material 120 thickness controls the size of the FETs (e.g., pFETs) formed from the underlying nanosheet stack as described in further detail below.

Figure 5:
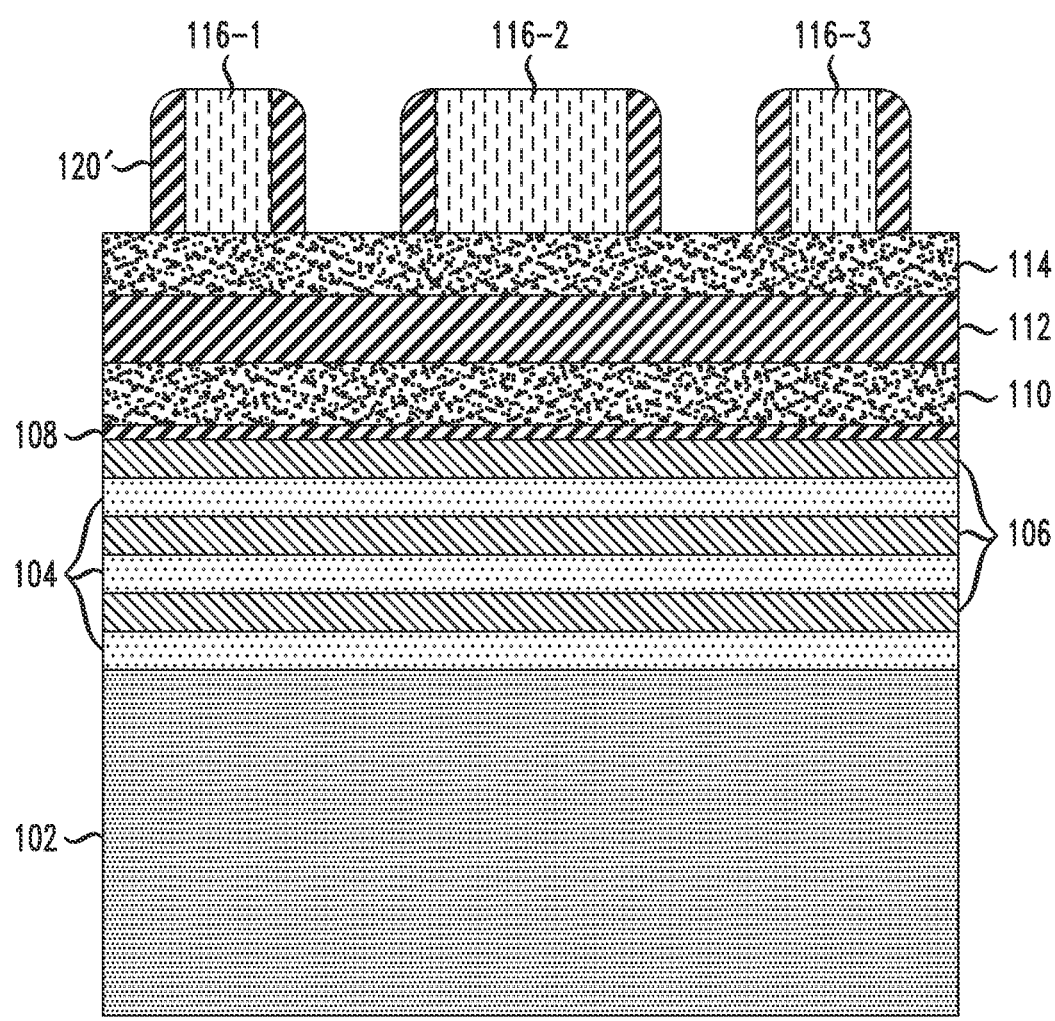
FIG. 5 depicts a side cross-sectional view of the FIG. 4 structure following etch-back of the spacer material, according to an embodiment of the invention.

FIG. 5 shows a side cross-sectional view 500 of the FIG. 4 structure following etch-back of the spacer material 120, resulting in sidewall spacers 120' on sidewalls of the patterning mandrels 116-1, 116-2 and 116-3.

Figure 6:
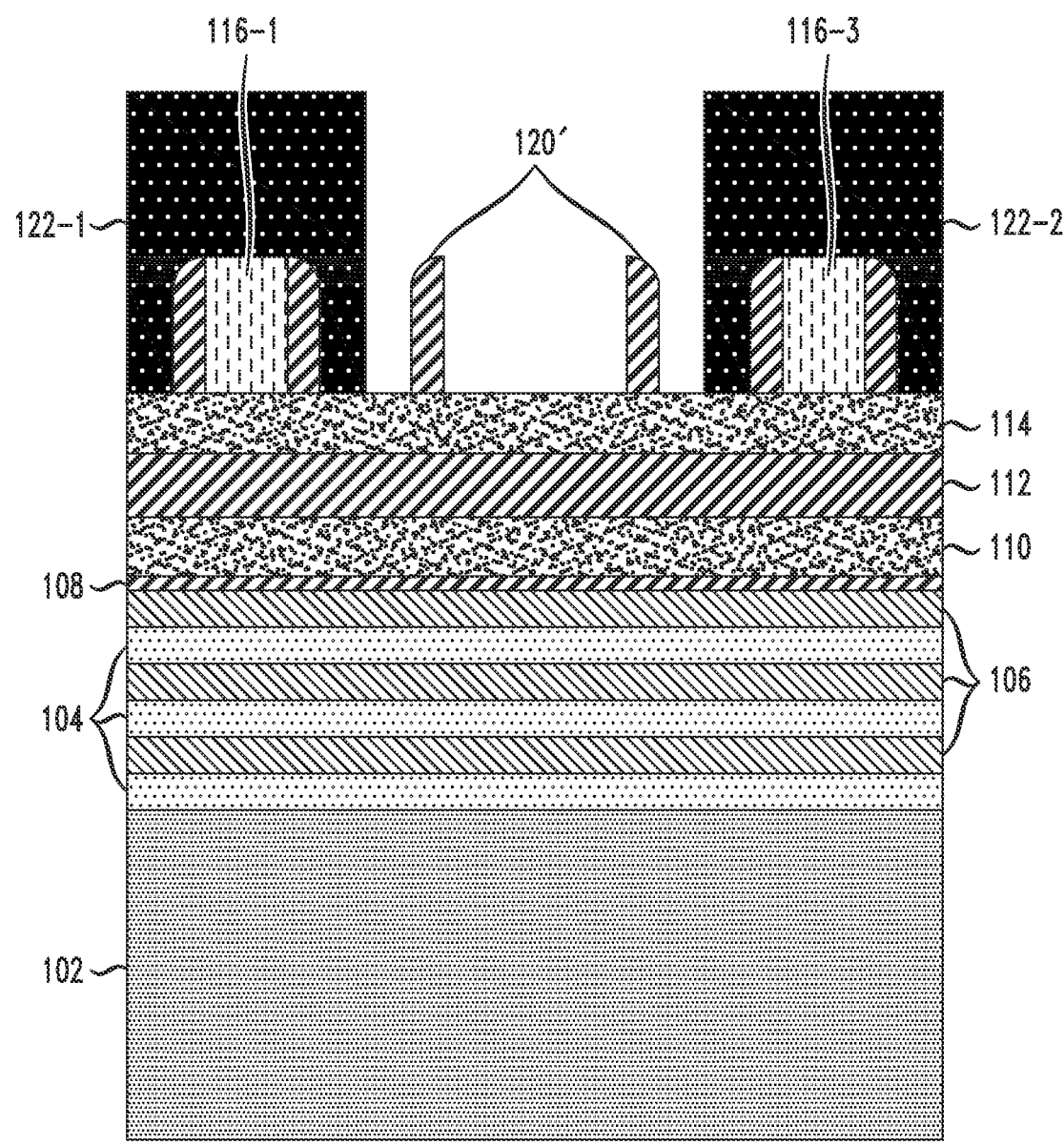
FIG. 6 depicts a side cross-sectional view of the FIG. 5 structure following patterning of a block mask and removal of the exposed patterning mandrel, according to an embodiment of the invention.

FIG. 6 shows a side cross-sectional view 600 of the FIG. 5 structure following patterning of a block mask including portions 122-1 and 122-2 (collectively, block mask 122) to cover the patterning mandrels 116-1 and 116-3, along with the spacer material 120' surrounding sidewalls of the patterning mandrels 116-1 and 116-3 as illustrated. This step may be referred to as a "pFET open" step where the spacer material 120' exposed by the block mask 122 is used to form pFET devices from the underlying nanosheet stack (e.g., using SADP). The block mask 122 may be formed of a suitable organic planarization layer (OPL) material, using spin-on coating or other suitable processing. The height or vertical thickness (in direction Y-Y') of the block mask 122 may be in the range of 100 nm to 1000 nm. FIG. 6 further illustrates the structure following removal of the exposed patterning mandrel 116-2, such as using reactive-ion etching (RIE).

Figure 7:
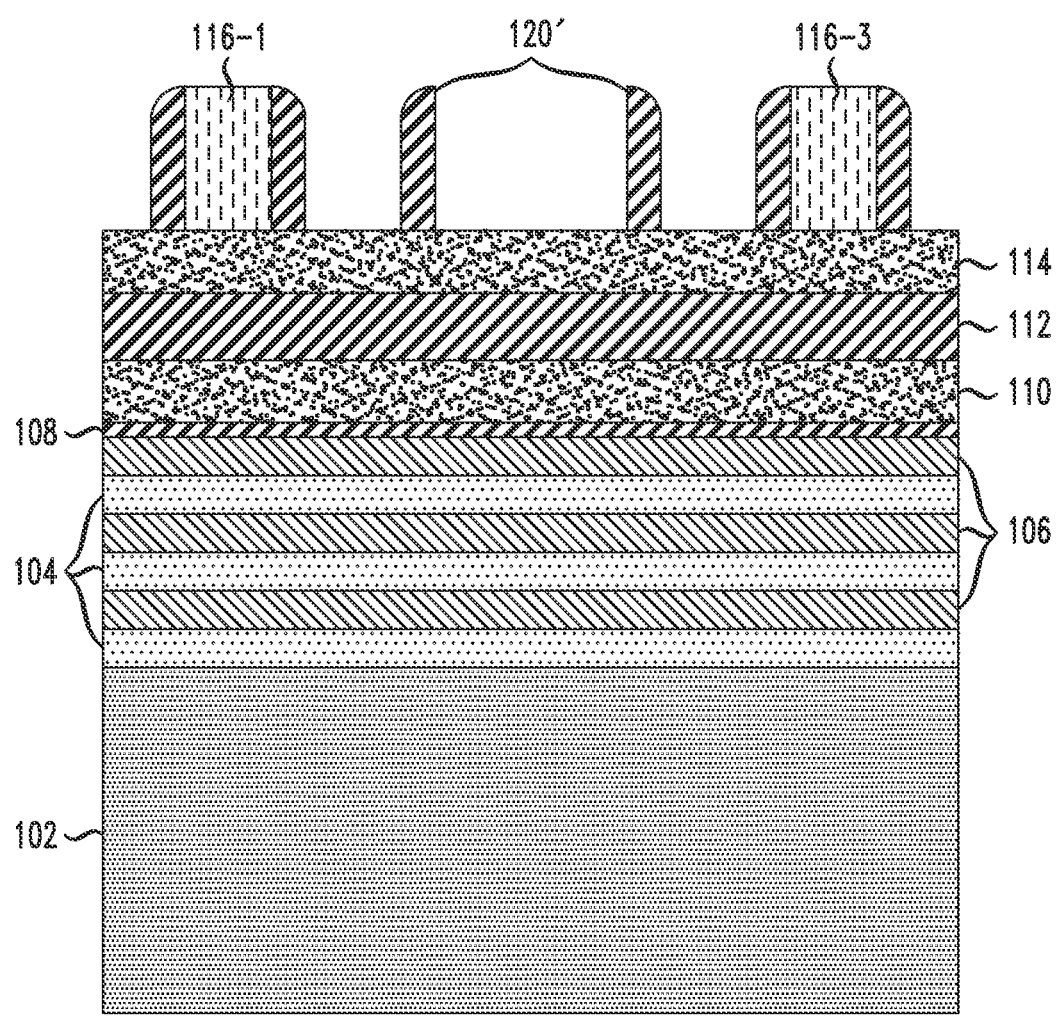
FIG. 7 depicts a side cross-sectional view of the FIG. 6 structure following removal of the block mask, according to an embodiment of the invention.

FIG. 7 shows a side cross-sectional view 700 of the FIG. 6 structure following removal of the block mask 122. The block mask 122 may be removed using dry asking, a wet clean, etc.

Figure 8:
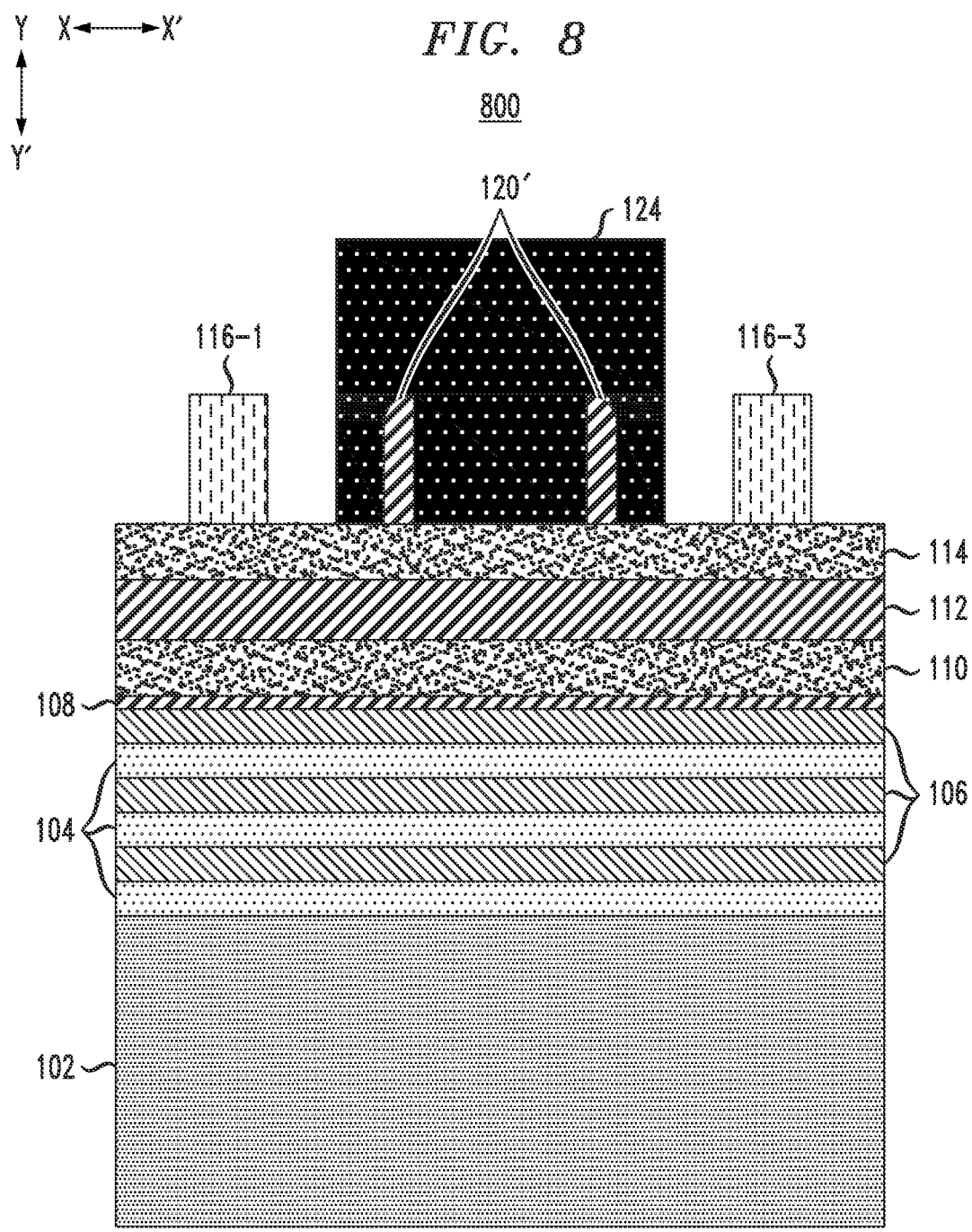
FIG. 8 depicts a side cross-sectional view of the FIG. 7 structure following patterning of an additional block mask and removal of exposed portions of the spacer material, according to an embodiment of the invention.

FIG. 8 shows a side cross-sectional view 800 following patterning of another block mask 124 to cover the spacer material 120' surrounding the removed patterning mandrel 116-2, exposing the patterning mandrels 116-1 and 116-3 as well as the spacer material 120' on sidewalls of the patterning mandrels 116-1 and 116-3. The block mask 124 may be formed of similar materials, with similar processing, and with similar sizing (in direction Y-Y') as the block mask 122. This step may be referred to as an "nFET open" step where the patterning mandrels 116-1 and 116-2 are used for direct printing nFET devices from the underlying nanosheet stack. FIG. 8 further shows removal of the spacer material 120' surrounding sidewalls of the patterning mandrels 116-1 and 116-3.

Figure 9:
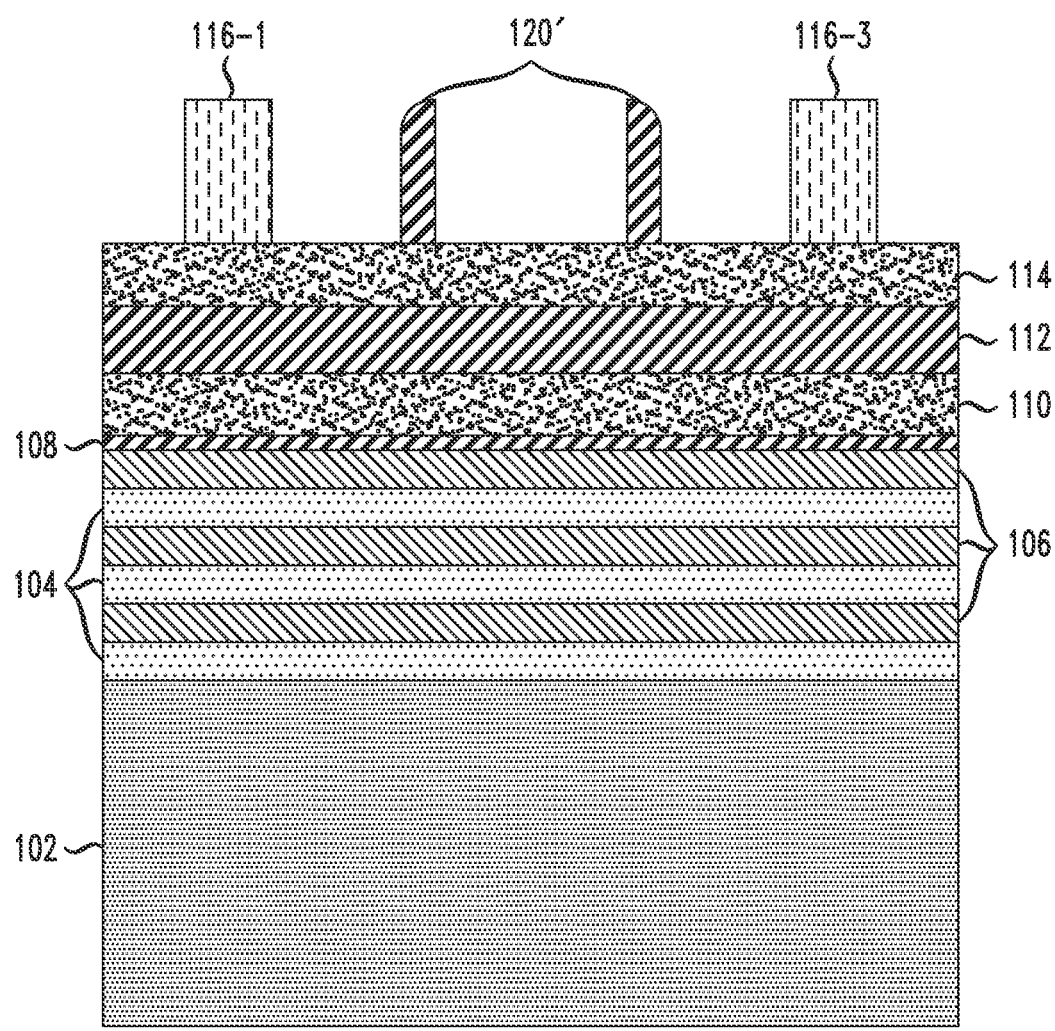
FIG. 9 depicts a side cross-sectional view of the FIG. 8 structure following removal of the additional block mask, according to an embodiment of the invention.

FIG. 9 shows a side cross-sectional view 900 of the FIG. 8 structure following removal of the block mask 124. The block mask 124 may be removed using processing similar to that described above with respect to removal of the block mask 122.

Figure 10:
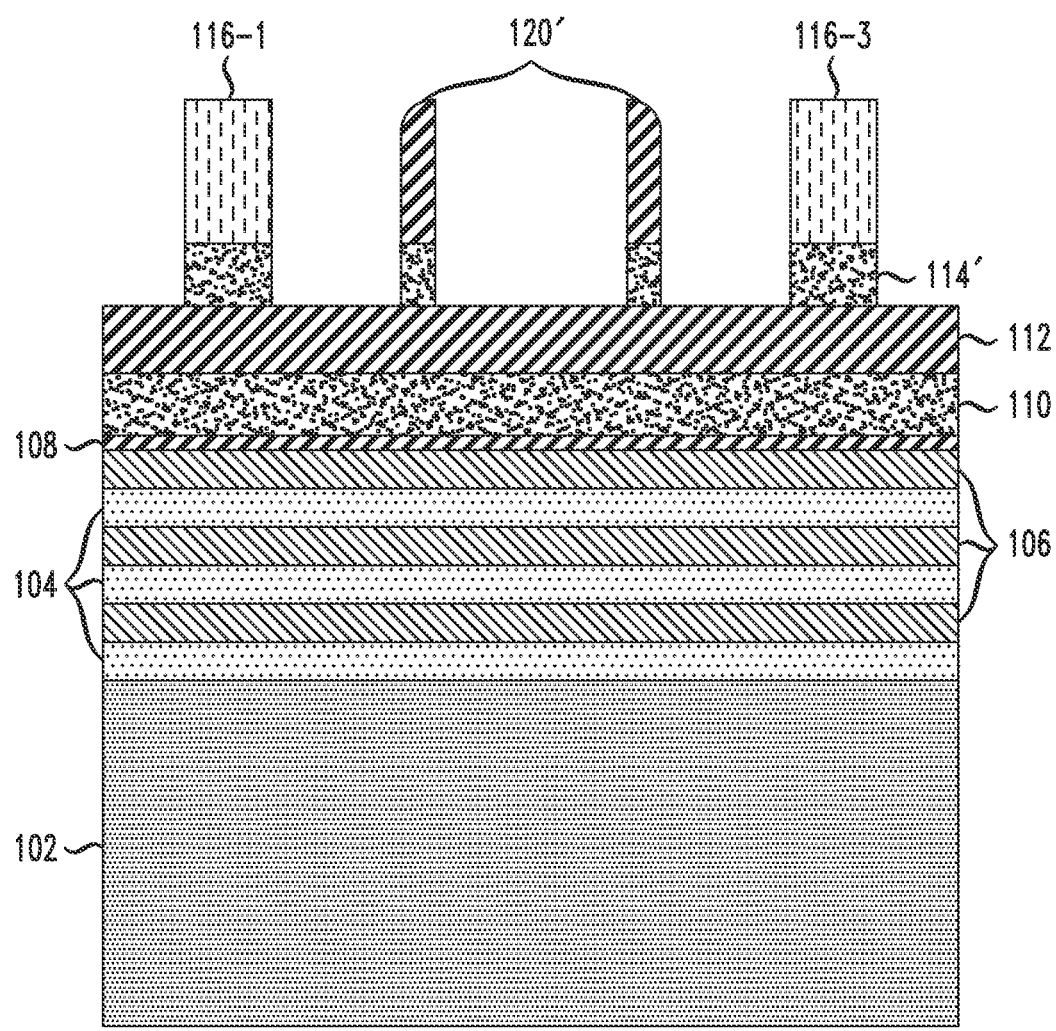
FIG. 10 depicts a side cross-sectional view of the FIG. 9 structure following etching of the top hard mask layer, according to an embodiment of the invention.

FIG. 10 shows a side cross-sectional view 1000 of the FIG. 9 structure following etching of the hard mask layer 114 that is exposed by the remaining patterning mandrels 116-1 and 116-3 and the remaining spacer sidewalk 120'. The hard mask layer 114 may be etched using RIE or other suitable processing. As a result, the hard mask layer 114' remains only below the patterning mandrels 116-1 and 116-3 and the remaining sidewall spacers 120'.

Figure 11:
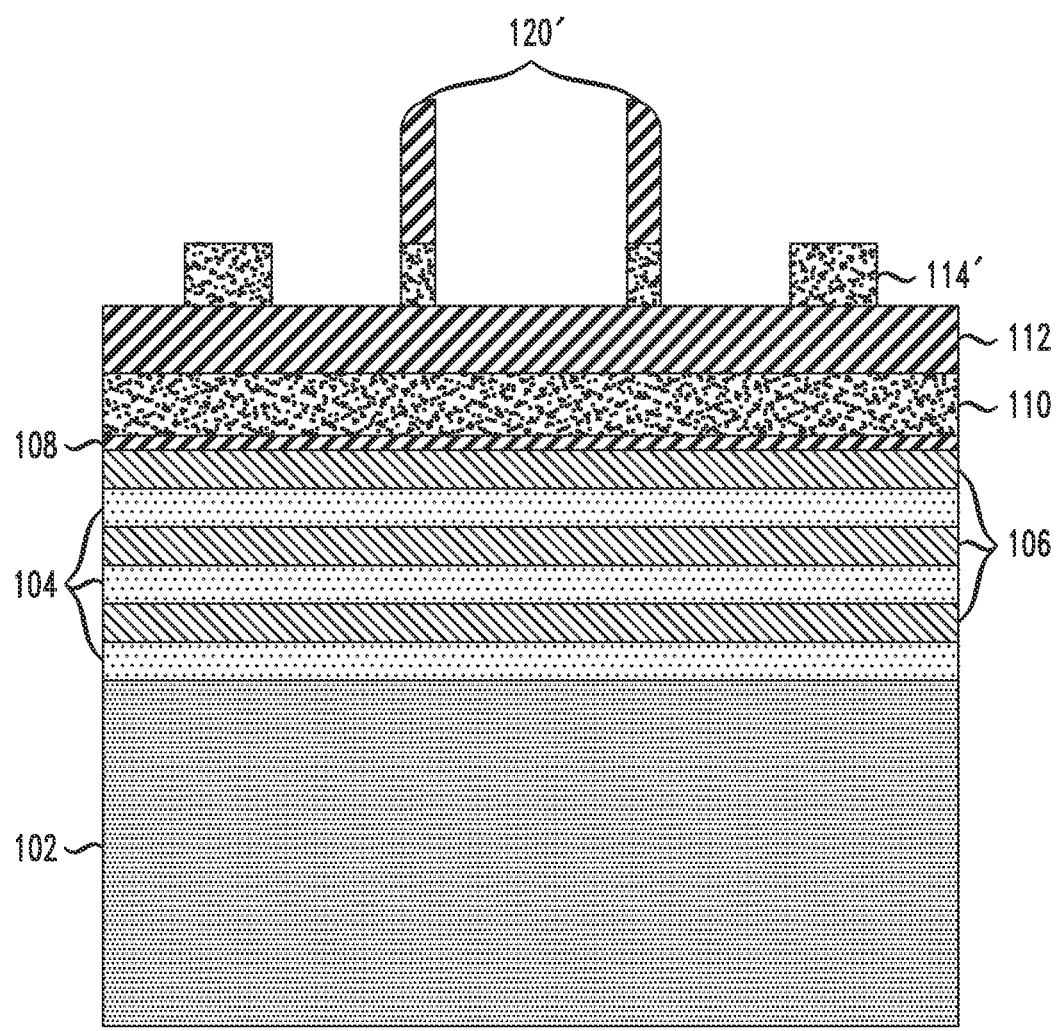
FIG. 11 depicts a side cross-sectional view of the FIG. 10 structure following removal of the remaining patterning mandrels, according to an embodiment of the invention.

FIG. 11 shows a side cross-sectional view 1100 of the FIG. 10 structure following removal of the patterning mandrels 116-1 and 116-3. The patterning mandrels 116-1 and 116-3 may be removed using processing similar to that described above with respect to removal of the patterning mandrel 116-2.

Figure 12:
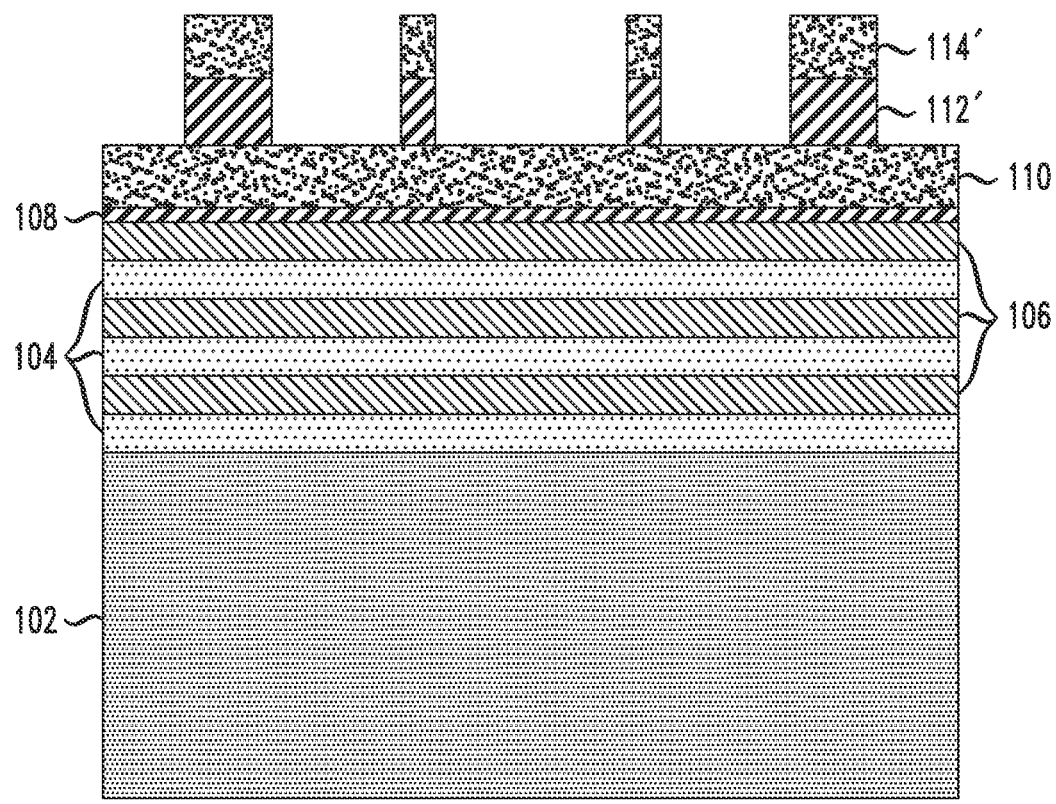
FIG. 12 depicts a side cross-sectional view of the FIG. 11 structure following etching of the remaining spacer material and the top-most remaining hard mask layer, according to an embodiment of the invention.

FIG. 12 shows a side cross-sectional view 1200 of the FIG. 11 structure following etching of the remaining sidewall spacers 120' and the hard mask layer 112, such that the hard mask layer 112' remains only under the hard mask layer 114'. As noted above, both the hard mask layer 112 and the sidewall spacers 120' may be formed of an oxide and may be removed using ME or other suitable processing.

Figure 13:
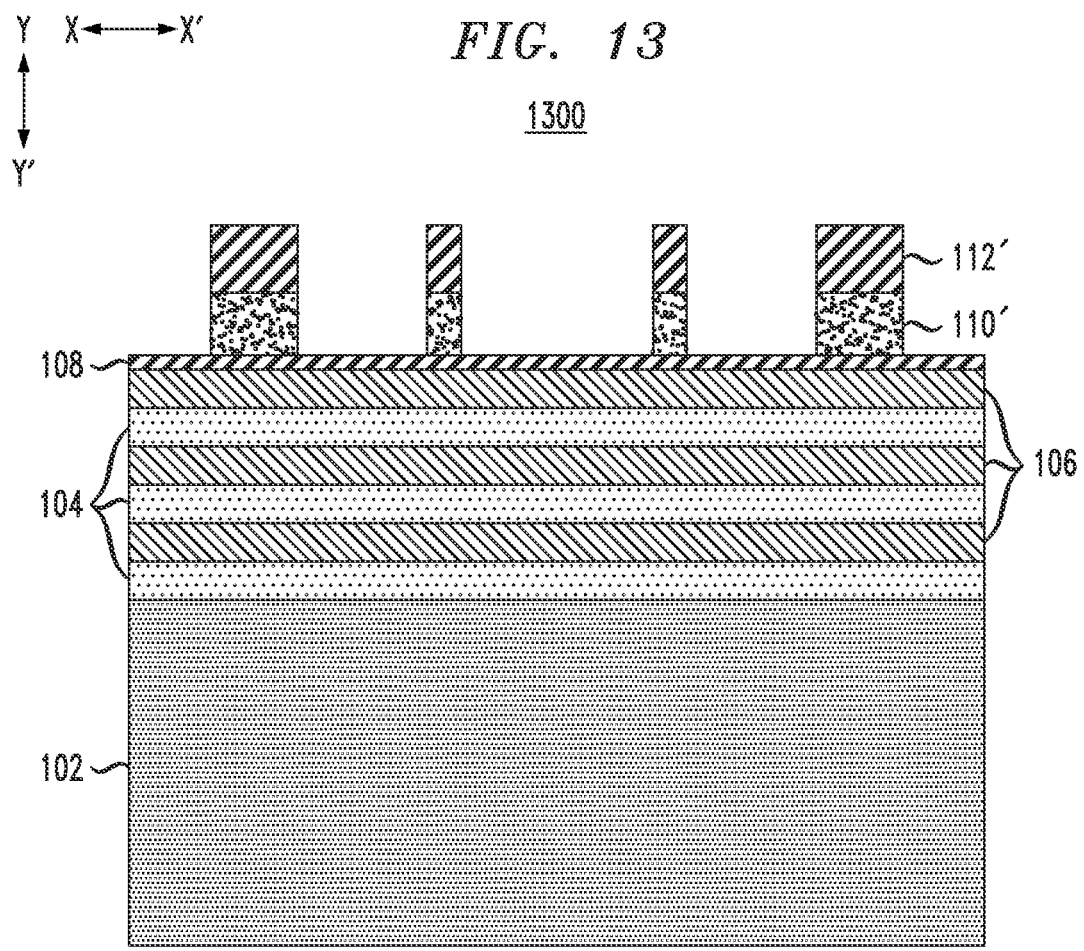
FIG. 13 depicts a side cross-sectional view of the FIG. 12 structure following etching of the last hard mask layer, according to an embodiment of the invention.

FIG. 13 shows a side cross-sectional view 1300 of the FIG. 12 structure following etching of the hard mask layer 110, exposing the padding layer 108 as shown, such that the hard mask layer 110' remains only under the hard mask layer 112'. The hard mask layer HO may be etched using processing similar to that described above with respect to etching of the hard mask layer 114. This step also removes the remaining hard mask layer 114', which, as described above, may be formed of the same material (e.g., a nitride) as the hard mask layer 110.

Figure 14:
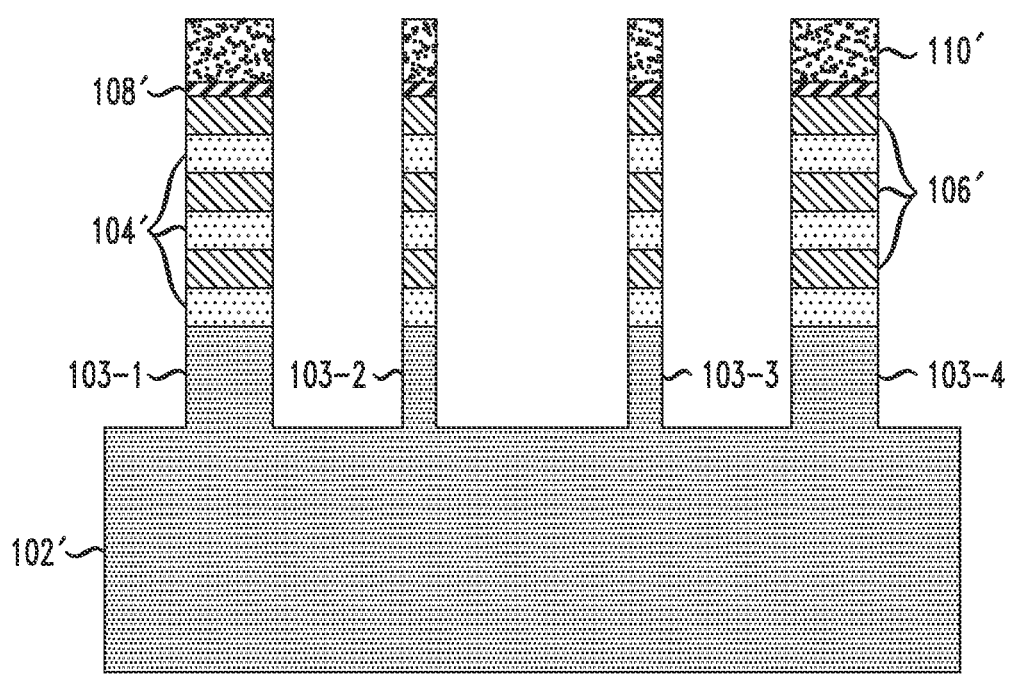
FIG. 14 depicts a side cross-sectional view of the FIG. 13 structure following open of the padding layer and etching of exposed portions of the nanosheet stack and a portion of the substrate, according to an embodiment of the invention.

FIG. 14 shows a side cross-sectional view 1400 of the FIG. 13 structure following open of the padding layer 108 and etching of the exposed portions of the nanosheet stack into a portion of the substrate 102. The padding layer 108, which may be formed of an oxide, may be opened using processing similar to that described above with respect to etching of the hard mask layer 112. This step also removes the remaining hard mask layer 112'.

The sacrificial layers 104 and channel layers 106 of the nanosheet stack, along with the substrate 102, may be etched using ME or another suitable process, such that portions 104', 106' and 102' of such layers remain as shown. The etching of the substrate 102 to form substrate 102' results in formation of fins 103-1 through 103-4 over the substrate 102' below the remaining portions of the sacrificial layers 104' and channel layers 106' of the nanosheet stack.

As noted above, in some embodiments the fins 103-1 and 103-4 may be used to form nFET nanosheet transistors, while the fins 103-2 and 103-3 are used to form pFET nanosheet transistors. Advantageously, the use of direct printing of the fins 103-1 and 103-4 and the use of SADP of the fins 103-2 and 103-3 requires only a single lithographic mask for primarily defining the placement of features, thereby reducing the OL penalty reduction or degradation that would otherwise impact gate and source/drain patterning (e.g., affecting parasitic capacitances of the resulting structures). Further, such techniques permit the formation of devices with different nanosheet widths enabling further scaling of various devices (e.g., including SRAM structures).

FIGS. 15-23 illustrate another process for using both direct print and SADP for forming nanosheet devices of different widths from the FIG. 1 structure. Whereas FIGS. 2-14 depict a "positive" tone process for forming the FIG. 14 structure, FIGS. 15-23 depicts a "negative" tone process for forming the FIG. 23 structure.

Figure 15:
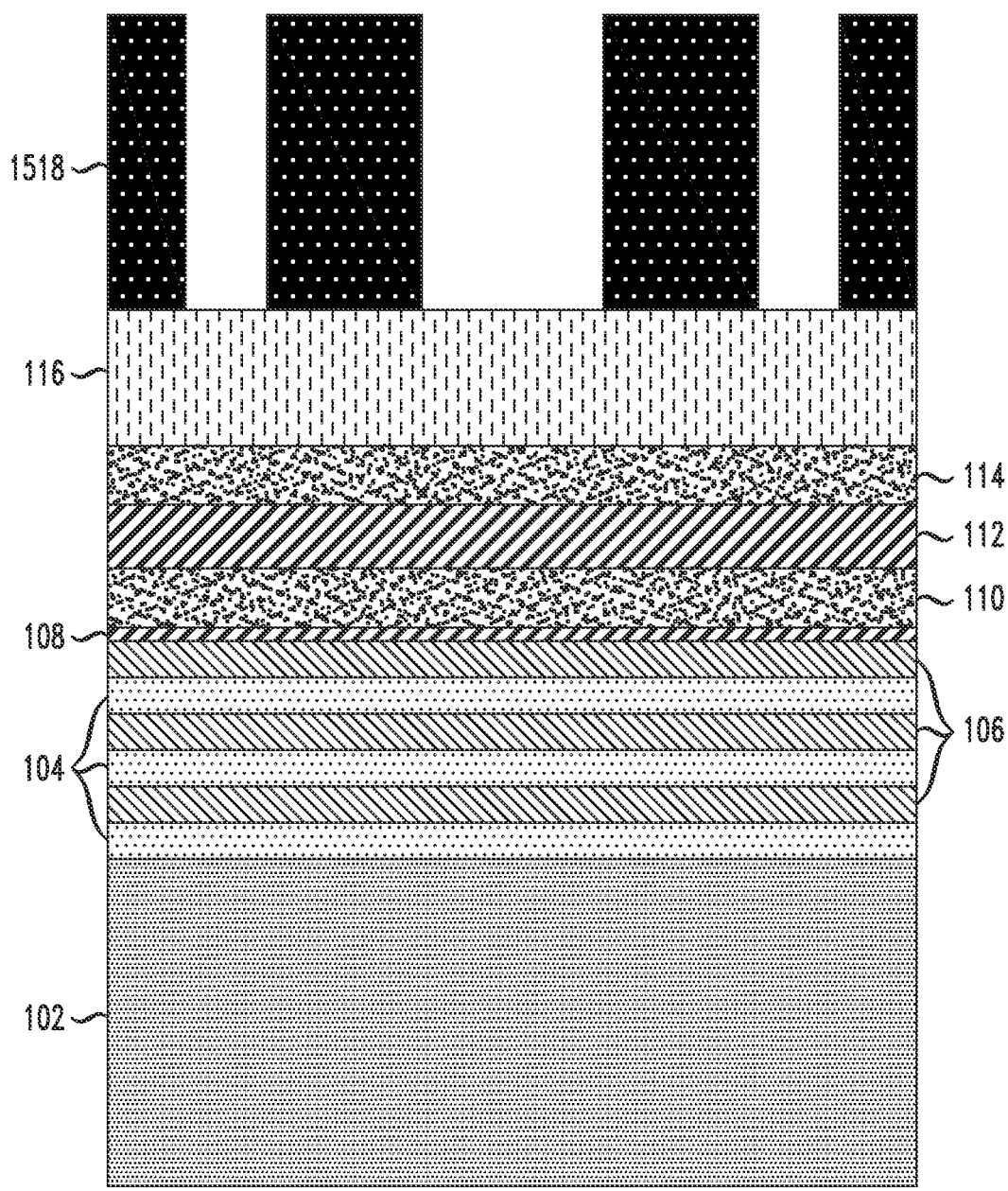
FIG. 15 depicts a side cross-sectional view of the FIG. 1 structure following patterning of a lithographic mask, according to an embodiment of the invention.

FIG. 15 shows a side cross-sectional view 1500 of the FIG. 1 structure following patterning of lithographic mask 1518, which may be formed of similar materials, with similar processing and with similar sizing (in direction Y-Y') as that described above with respect to lithographic mask 118. Whereas the lithographic mask 118 provides positive tone for defining where the underlying patterning layer 116 would remain (e.g., patterning mandrels 116-1, 116-2 and 116-3), the lithographic mask 1518 provides negative tone for defining where the underlying patterning layer 116 will remain following further processing described below.

FIG. 16 shows a side cross-sectional view 1600 of the FIG. 15 structure following removal of exposed portions of the patterning layer 116 (e.g., using processing similar to that described above with respect to FIG. 3), resulting in patterning mandrels 1516 as shown. The lithographic mask 1518 is then removed, using processing similar to that described above with respect to removal of the lithographic mask 118.

Figure 17:
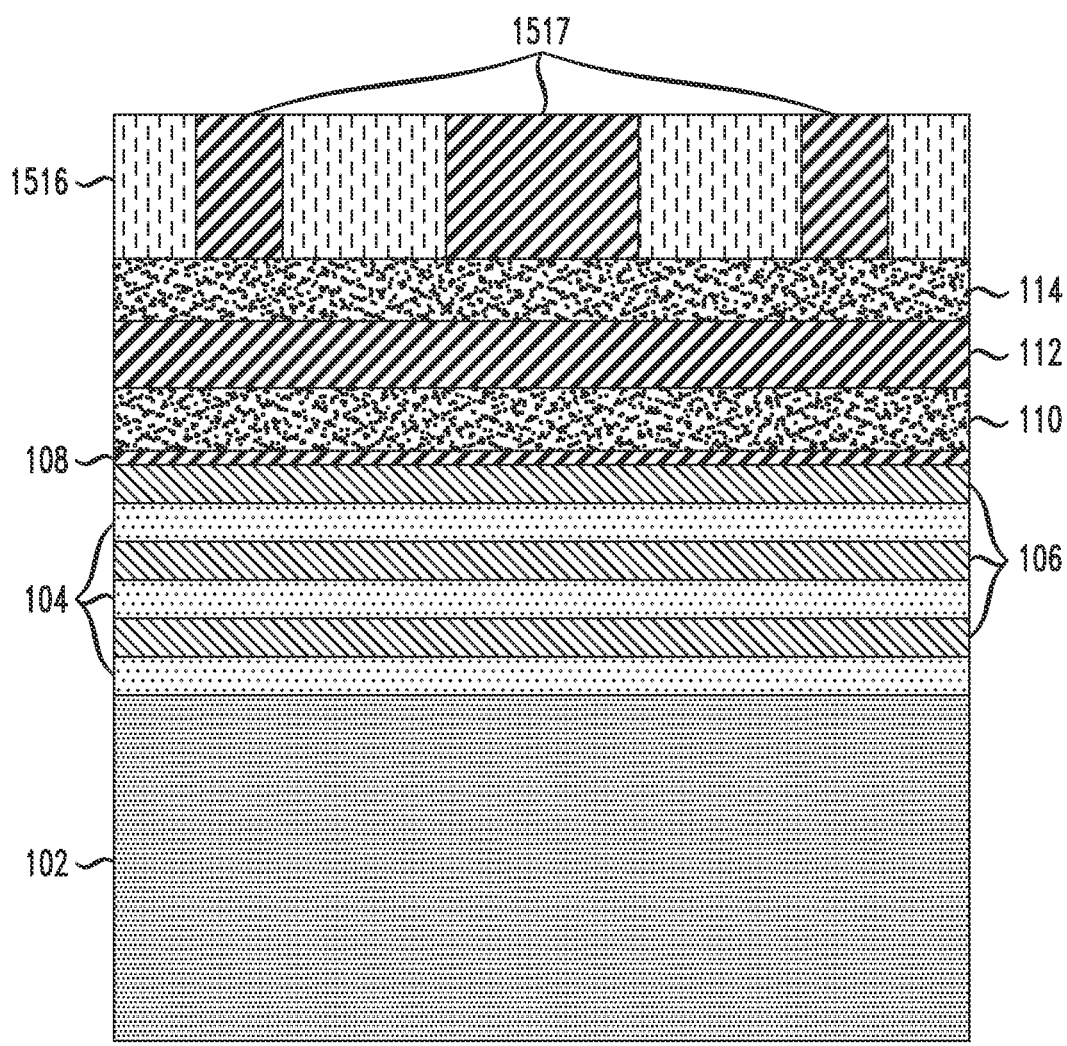
FIG. 17 depicts a side cross-sectional view of the FIG. 16 structure following fill and etch-back of an oxide material, according to an embodiment of the invention.

FIG. 17 shows a side cross-sectional view 1700 of the FIG. 16 structure following fill and etch-back of an oxide material 1517. The oxide material 1517 may be formed using spin-on coating, deposition fill or another suitable process to overfill the spaces formed by removal or etching of the exposed portions of the patterning layer 116 (e.g., to fill the spaces between the patterning mandrels 1516). The etch-back is used to planarize the oxide material 1517 to match a top surface of the patterning mandrels 1516. The oxide material 1517 may comprise silicon oxide ($SiO_x$), a metal oxide, etc.

Figure 18:
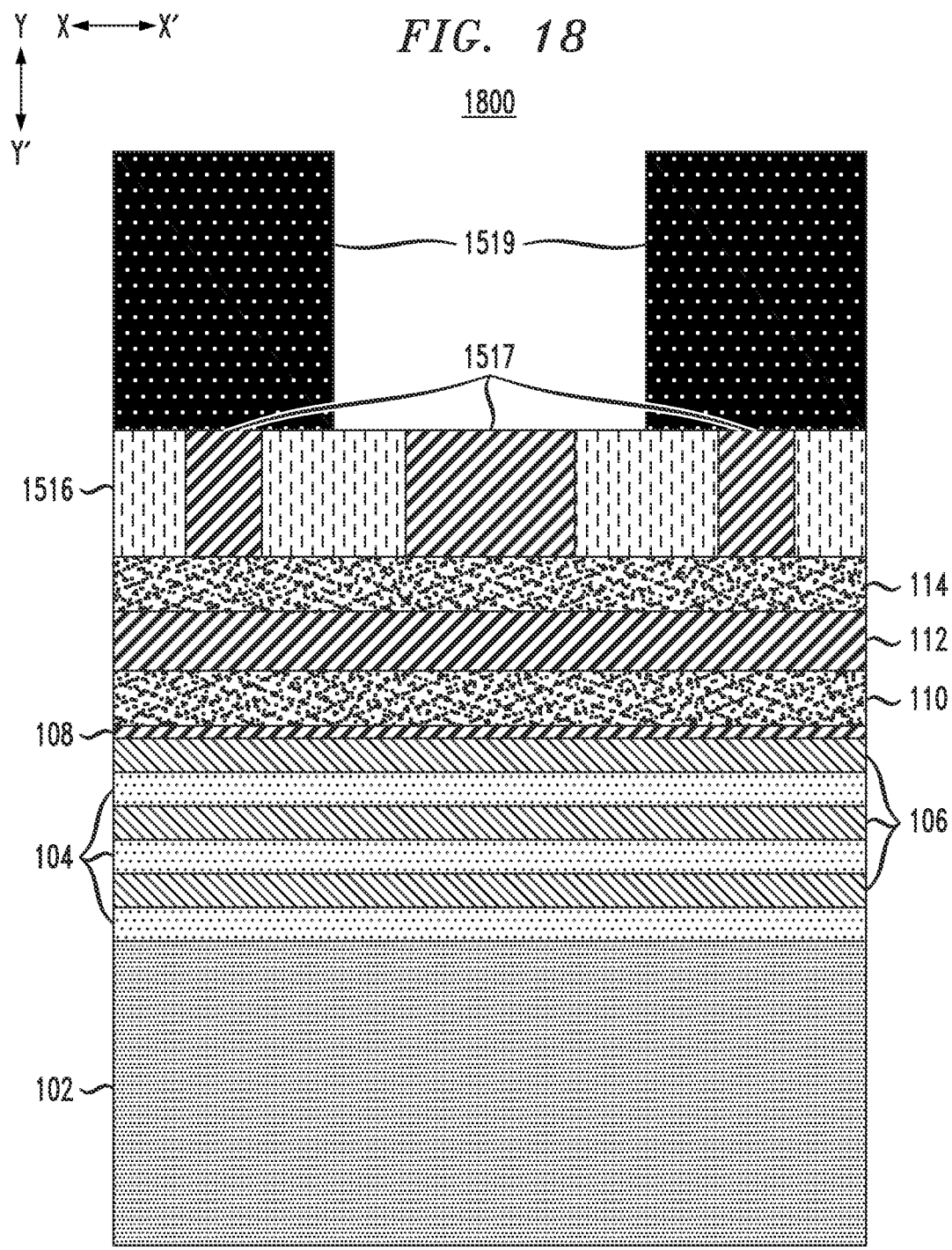
FIG. 18 depicts a side cross-sectional view of the FIG. 17 structure following patterning of a block mask to expose a portion of the oxide material, according to an embodiment of the invention.

FIG. 18 shows a side cross-sectional view 1800 of the FIG. 17 structure following patterning of a block mask 1519 that exposes a portion of the oxide material 1517 in the middle of the structure (e.g., where pFET devices will be formed from the underlying nanosheet stack as described above). The block mask 1519 may be formed of materials similar to that of block masks 122 and 124, using similar processing and with similar sizing (in direction Y-Y').

Figure 19:
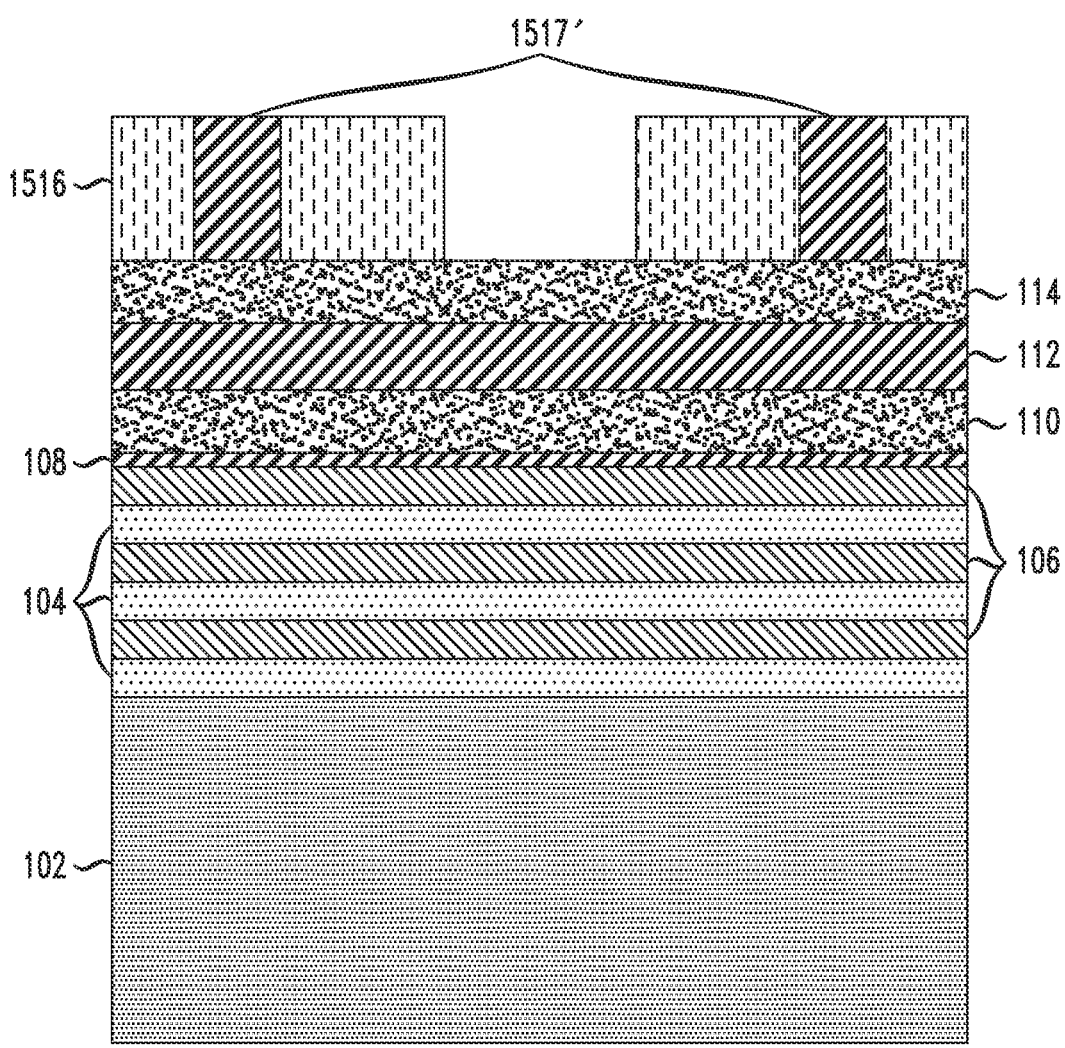
FIG. 19 depicts a side cross-sectional view of the FIG. 18 structure following removal of the exposed portion of the oxide material and following removal of the block mask, according to an embodiment of the invention.

FIG. 19 shows a side cross-sectional view 1900 of the FIG. 18 structure following removal of the exposed portion of the oxide layer 1517 such that oxide layer 1517' remains. The block mask 1519 is then removed, using processing similar to that described above with respect to removal of block masks 122 and 124.

Figure 20:
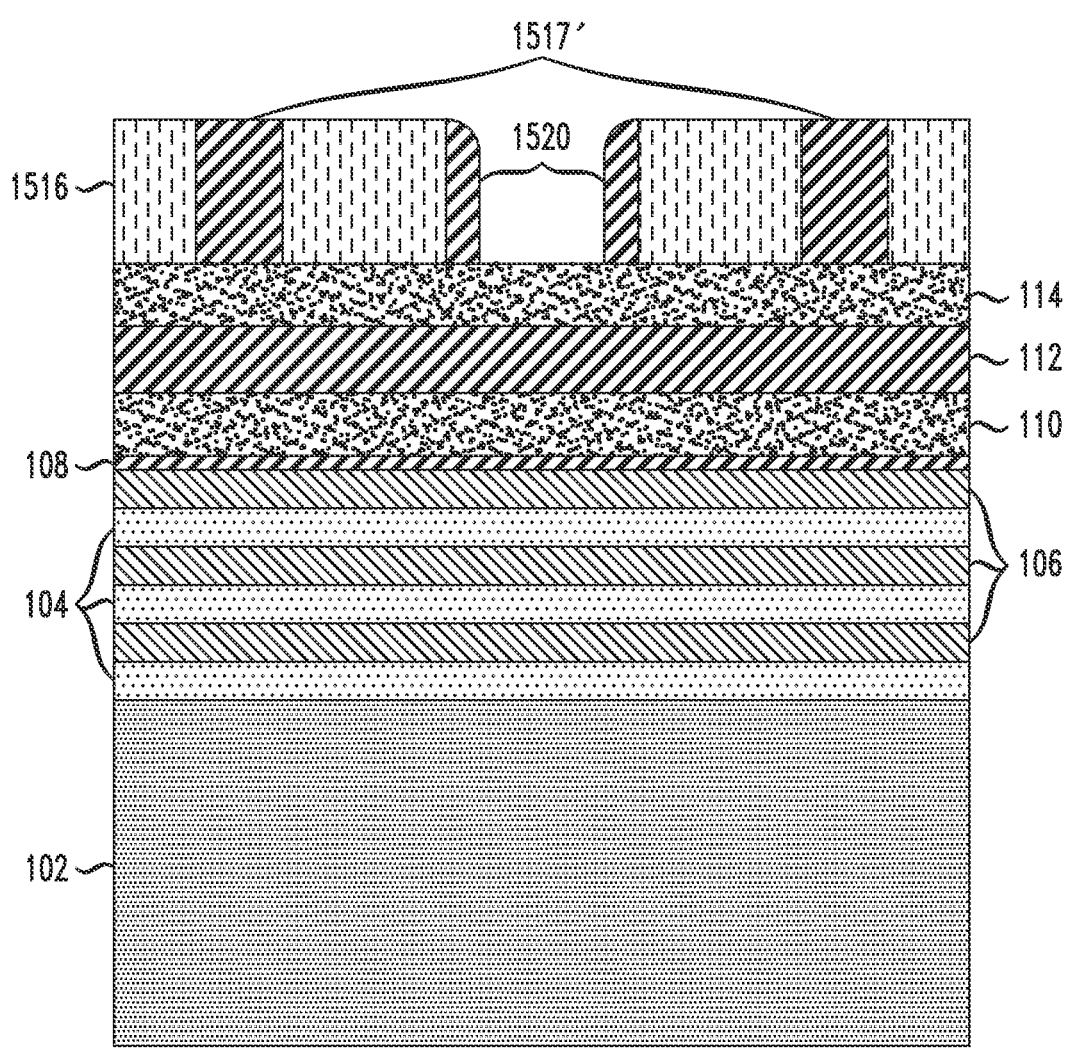
FIG. 20 depicts a side cross-sectional view of the FIG. 19 structure following deposition and etch-back of a spacer, according to an embodiment of the invention.

FIG. 20 shows a side cross-sectional view 2000 of the FIG. 19 structure, following deposition and etch-back of a spacer material 1520. The spacer material 1520 may be formed of similar materials and with similar sizing as that described above with respect to spacer material 120.

Figure 21:
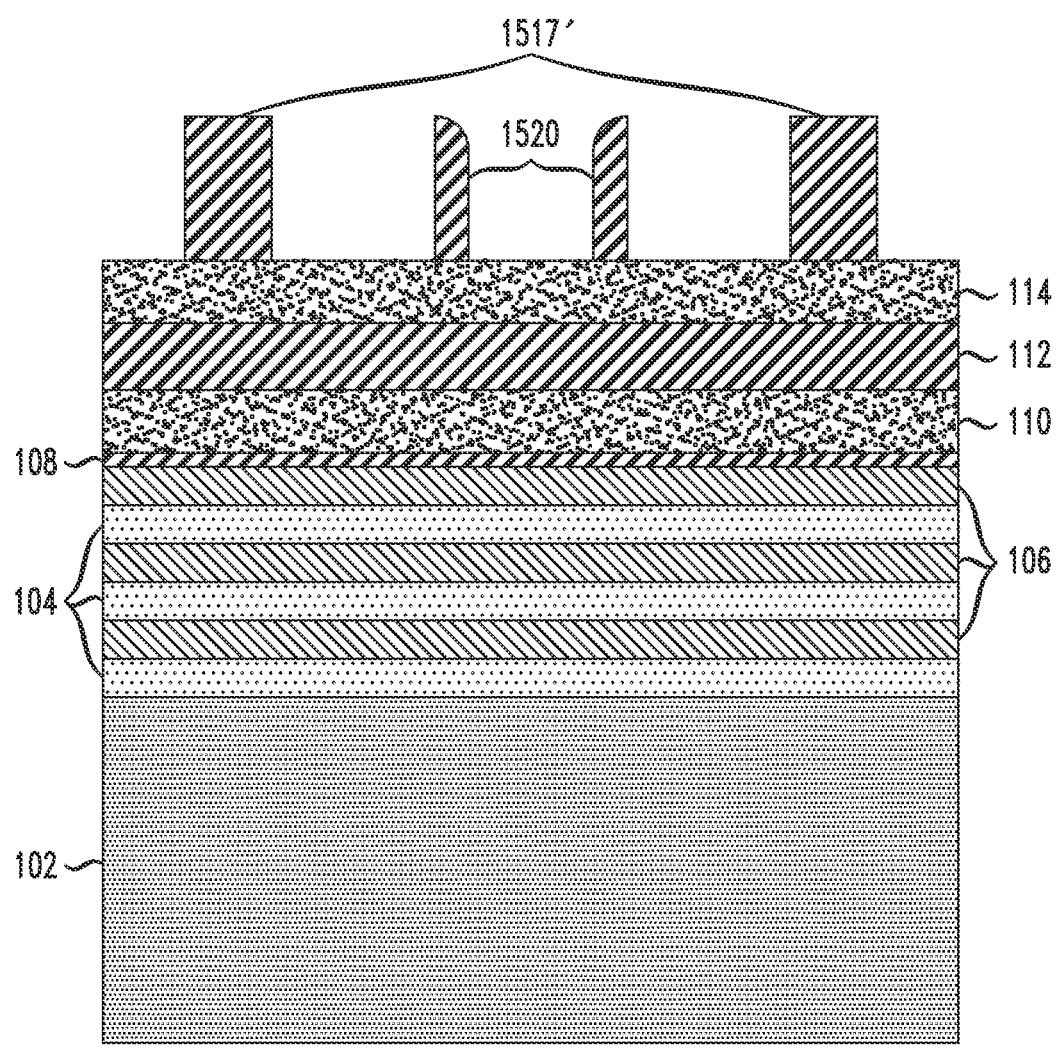
FIG. 21 depicts a side cross-sectional view of the FIG. 20 structure following removal of a remaining portion of the patterning layer, according to an embodiment of the invention.

FIG. 21 shows a side cross-sectional view 2100 of the FIG. 20 structure following removal of the patterning mandrels 1516, using processing similar to that described above with respect to removal of patterning layer 116 and patterning mandrels 116-1, 116-2 and 116-3.

Figure 22:
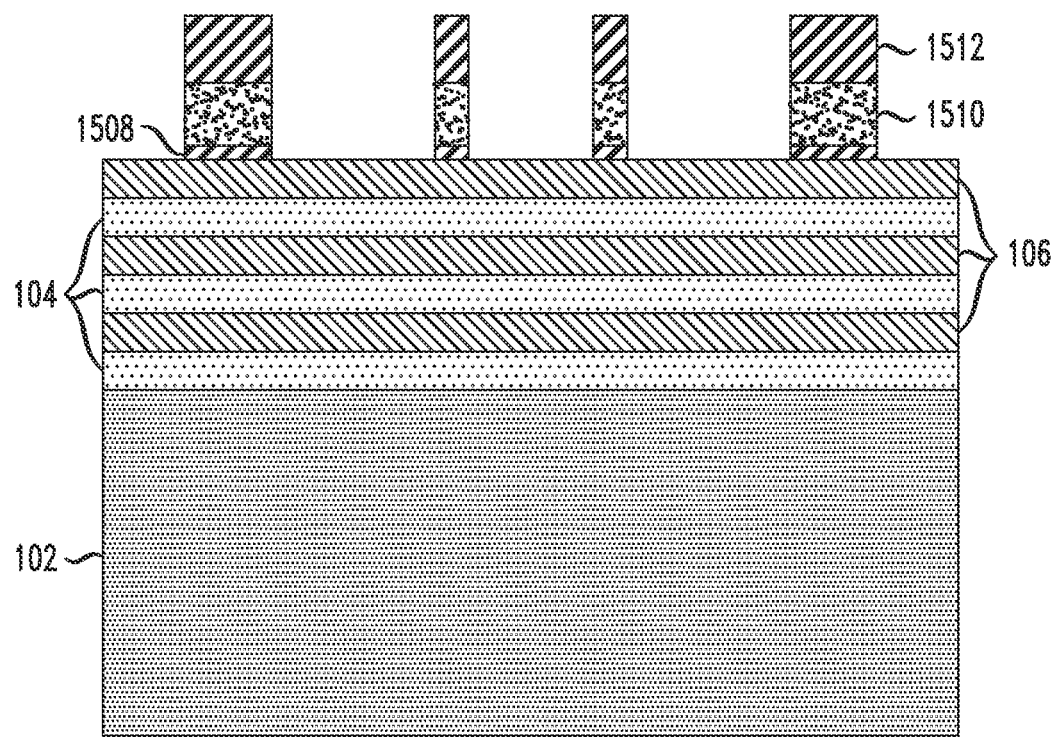
FIG. 22 depicts a side cross-sectional view of the FIG. 21 structure following open of the top hard mask layer, according to an embodiment of the invention.

FIG. 22 shows a side cross-sectional view 2200 of the FIG. 21 structure following open of the hard mask layers 114, 112 and 110 exposed by the remaining oxide layer 1517' and spacer material 1520. The exposed portions of the hard mask layers 114, 112 and 110 may be removed using processing similar to that described above with respect to etching these layers in conjunction with FIGS. 9-13. The padding layer 108 is also opened using processing similar to that described above. As a result, the FIG. 22 structure includes remaining portions 1508, 1510 and 1512 of the padding layer 108, hard mask layer 110 and hard mask layer 112, respectively.

FIG. 23 shows a side cross-sectional view 2300 of the FIG. 22 structure following etching of exposed portions of the nanosheet stack into a portion of the substrate 102, such that portions 1506, 1504 and 1502 remain of the channel layers 106, sacrificial layers 104 and substrate 102, respectively. This forms fins 1503-1, 1503-2, 1503-3 and 1504-4 (collectively, fins 1504) similar to the fins 103. The sacrificial layers 104 and channel layers 106 of the nanosheet stack, along with the substrate 102, may be etched using processing similar to that described above with respect to FIG. 14.

Similar to the FIG. 14 structure, the fins 1503-1 and 1503-4 may be used to form nFET nanosheet transistors, while the fins 1503-2 and 1503-3 are used to form pFET nanosheet transistors. Advantageously, the use of direct printing of the fins 1503-1 and 1503-4 and the use of SADP of the fins 1503-2 and 1503-3 requires only a single lithographic mask for primarily defining the placement of features, thereby reducing the OL penalty reduction or degradation that would otherwise impact gate and source/drain patterning (e.g., affecting parasitic capacitances of the resulting structures). Further, such techniques permit the formation of devices with different nanosheet widths enabling further scaling of various devices (e.g., including SRAM structures).

The structures shown in FIGS. 14 and 23 may be subject to various additional processing to form nanosheet FETs. This may include, for example, formation of shallow trench isolation (STI) regions surrounding the fins 103/1503, formation and patterning of dummy gate structures, epitaxial growth of source/drain regions, formation of inner spacers, removal of the sacrificial layers to form gate structures using a replacement metal gate (RMG) process, formation of contacts to the gate structures and source/drain regions, etc.

In some embodiments, a method of forming a semiconductor structure comprises forming a nanosheet stack comprising alternating layers of a sacrificial material and a channel material over a substrate, the layers of channel material providing nanosheet channels for one or more nanosheet FETs. The method also comprises forming a hard mask stack over the nanosheet stack, and forming a patterning layer over the hard mask stack. The method further comprises patterning a lithographic mask over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using SADP. The second width is less than the first width.

The lithographic mask, in some embodiments, is patterned over the patterning layer such that the lithographic material covers the one or more first regions and the one or more second regions. The lithographic mask, in other embodiments, is patterned over the patterning layer such that lithographic material exposes the one or more first regions and the one or more second regions.

The hard mask stack may comprise a padding oxide layer and a NON hard mask stack over the padding oxide layer. The patterning layer may comprise a-Si.

In some embodiments, a method of forming a semiconductor structure comprises forming a nanosheet stack comprising alternating layers of a sacrificial material and a channel material over a substrate, the layers of channel material providing nanosheet channels for one or more nanosheet FETs. The method also comprises forming a hard mask stack over the nanosheet stack, and forming a patterning layer over the hard mask stack. The method further comprises patterning a lithographic mask over the patterning layer, the lithographic mask covering (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using SADP. The second width is less than the first width.

The method may further comprise etching portions of the patterning layer exposed by the lithographic mask to form a plurality of patterning mandrels, and removing the lithographic mask.

The method may further comprise depositing a spacer material over the plurality of patterning mandrels and portions of a top surface of the hard mask stack exposed by etching of the portions of the patterning layer exposed by the lithographic mask, and etching-back the spacer material to remove the spacer material from top surfaces of the plurality of patterning mandrels and to remove the spacer material from portions of the top surface of the hard mask layer, leaving sidewalls spacers surrounding the plurality of patterning mandrels.

The method may further comprise forming a first block mask covering at least a first subset of the plurality of patterning mandrels and the sidewall spacers surrounding the first subset of the plurality of patterning mandrels and exposing at least a second subset of the plurality of patterning mandrels and the sidewall spacers surrounding the second subset of the plurality of patterning mandrels. The first subset of the plurality of patterning mandrels provide for direct printing of the one or more fins of the first width and the second subset of the plurality of patterning mandrels provide SADP for setting the spacing between the two or more fins of the second width.

The method may further comprise removing the second subset of the plurality of patterning mandrels leaving the sidewall spacers surrounding the second subset of the plurality of patterning mandrels, and removing the first block mask.

The method may further comprise forming a second block mask covering the sidewall spacers surrounding the second subset of the plurality of patterning mandrels and exposing the first subset of the plurality of patterning mandrels and the sidewall spacers surrounding the first subset of the plurality of patterning mandrels.

The method may further comprise removing the sidewall spacers surrounding the first subset of the plurality of patterning mandrels exposed by the second block mask, and removing the second block mask.

The method may further comprise etching the hard mask stack, the nanosheet stack and at least a portion of the substrate to form the one or more fins of the first width below the first subset of the plurality of patterning mandrels and to form the one or more fins of the second width below the remaining sidewall spacers.

In some embodiments, a method of forming a semiconductor structure comprises forming a nanosheet stack comprising alternating layers of a sacrificial material and a channel material over a substrate, the layers of channel material providing nanosheet channels for one or more nanosheet FETs. The method also comprises forming a hard mask stack over the nanosheet stack, and forming a patterning layer over the hard mask stack. The method further comprises patterning a lithographic mask over the patterning layer, the lithographic mask exposing (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using SADP. The second width is less than the first width.

The method may further comprise etching portions of the patterning layer exposed by the lithographic mask to form a plurality of patterning mandrels, and removing the lithographic mask.

The method may further comprise depositing an oxide material over portions of a top surface of the hard mask stack exposed by etching of the portions of the patterning layer exposed by the lithographic mask, and etching-back the oxide material to form a plurality of oxide mandrels over the top surface of the hard mask stack between the plurality of patterning mandrels.

The method may further comprise forming a block mask covering at least a first subset of the plurality of oxide mandrels and exposing at least a second subset of the plurality of oxide mandrels. The first subset of the plurality of oxide mandrels provide for direct printing of the one or more fins of the first width and the second subset of the plurality of oxide mandrels provide SADP for setting the spacing between the two or more fins of the second width.

The method may further comprise removing the second subset of the plurality of oxide mandrels, and removing the block mask.

The method may further comprise forming a spacer material over portions of the top surface of the hard mask stack exposed by the removal of the second subset of the plurality of oxide mandrels and over top surfaces of the first subset of the plurality of oxide mandrels and the plurality of patterning mandrels, and etching back the spacer material to form sidewall spacers adjacent sidewalls of the plurality of patterning mandrels exposed by removal of the second subset of the plurality of oxide mandrels.

The method may further comprise removing the plurality of patterning mandrels, and etching the hard mask stack, the nanosheet stack and at least a portion of the substrate to form the one or more fins of the first width below the first subset of the plurality of oxide mandrels and to form the one or more fins of the second width below the sidewall spacers.

In some embodiments, a semiconductor structure comprises a substrate and a nanosheet stack disposed over the substrate, the nanosheet stack comprising alternating layers of a sacrificial material and a channel material, the layers of channel material providing nanosheet channels for one or more nanosheet FETs. The semiconductor structure also comprises a hard mask stack disposed over the nanosheet stack, and a patterning layer disposed over the hard mask stack. The semiconductor structure further comprise a lithographic mask disposed over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using SADP. The second width is less than the first width.

The lithographic mask, in some embodiments, covers the one or more first regions and the one or more second regions. The lithographic mask, in other embodiments, exposes the one or more first regions and the one or more second regions.

The nanosheet stacks over the one or more fins of the first width may provide channels for nFETs and the nanosheet stacks disposed over the one or more fins of the second width may provide channels for pFETs.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure comprising:
    forming a nanosheet stack comprising alternating layers of a sacrificial material and a channel material over a substrate, the layers of channel material providing nanosheet channels for one or more nanosheet field-effect transistors;
    forming a hard mask stack over the nanosheet stack;
    forming a patterning layer over the hard mask stack; and
    patterning a lithographic mask over the patterning layer, the lithographic mask defining (i) one or more first regions for direct printing of one or more fins of a first width in the nanosheet stack and the substrate and (ii) one or more second regions for setting the spacing between two or more fins of a second width in the nanosheet stack and the substrate using self-aligned double patterning;
    wherein the second width is less than the first width.

2. The method of claim 1, wherein the lithographic mask is patterned over the patterning layer such that the lithographic material covers the one or more first regions and the one or more second regions.

3. The method of claim 1, wherein the lithographic mask is patterned over the patterning layer such that lithographic material exposes the one or more first regions and the one or more second regions.

4. The method of claim 1, wherein the hard mask stack comprises a padding oxide layer and a nitride-oxide-nitride hard mask stack over the padding oxide layer.

5. The method of claim 1, wherein the patterning layer comprises amorphous silicon (a-Si).

6. A method of forming a semiconductor structure comprising:
    forming a nanosheet stack comprising alternating layers of a sacrificial material and a channel material over a substrate, the layers of channel material providing nanosheet channels for one or more nanosheet field-effect transistors;

forming a hard mask stack over the nanosheet stack;

forming a patterning layer over the hard mask stack; and patterning a lithographic mask over the patterning layer, the lithographic mask covering (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using self-aligned double patterning;

wherein the second width is less than the first width.

7. The method of claim 6, further comprising:

etching portions of the patterning layer exposed by the lithographic mask to form a plurality of patterning mandrels; and removing the lithographic mask.

8. The method of claim 7, further comprising:

depositing a spacer material over the plurality of patterning mandrels and portions of a top surface of the hard mask stack exposed by etching of the portions of the patterning layer exposed by the lithographic mask; and etching-back the spacer material to remove the spacer material from top surfaces of the plurality of patterning mandrels and to remove the spacer material from portions of the top surface of the hard mask layer, leaving sidewalls spacers surrounding the plurality of patterning mandrels.

9. A method of forming a semiconductor structure comprising:

forming a nanosheet stack comprising alternating layers of a sacrificial material and a channel material over a substrate, the layers of channel material providing nanosheet channels for one or more nanosheet field-effect transistors;

forming a hard mask stack over the nanosheet stack;

forming a patterning layer over the hard mask stack;

patterning a lithographic mask over the patterning layer, the lithographic mask covering (i) one or more first regions of a top surface of the patterning layer for direct printing of one or more fins of a first width in the nanosheet stack and the substrate and (ii) one or more second regions of the top surface of the patterning layer for setting the spacing between two or more fins of a second width in the nanosheet stack and the substrate using self-aligned double patterning;

wherein the second width is less than the first width;

etching portions of the patterning layer exposed by the lithographic mask to form a plurality of patterning mandrels;

removing the lithographic mask;

depositing a spacer material over the plurality of patterning mandrels and portions of a top surface of the hard mask stack exposed by etching of the portions of the patterning layer exposed by the lithographic mask;

etching-back the spacer material to remove the spacer material from top surfaces of the plurality of patterning mandrels and to remove the spacer material from portions of the top surface of the hard mask layer, leaving sidewalls spacers surrounding the plurality of patterning mandrels; and forming a first block mask covering at least a first subset of the plurality of patterning mandrels and the sidewall spacers surrounding the first subset of the plurality of patterning mandrels and exposing at least a second subset of the plurality of patterning mandrels and the sidewall spacers surrounding the second subset of the plurality of patterning mandrels, wherein the first subset of the plurality of patterning mandrels provide for direct printing of the one or more fins of the first width and the second subset of the plurality of patterning mandrels provide self-aligned double patterning for setting the spacing between the two or more fins of the second width.

10. The method of claim 9, further comprising:

removing the second subset of the plurality of patterning mandrels leaving the sidewall spacers surrounding the second subset of the plurality of patterning mandrels; and removing the first block mask.

11. The method of claim 10, further comprising forming a second block mask covering the sidewall spacers surrounding the second subset of the plurality of patterning mandrels and exposing the first subset of the plurality of patterning mandrels and the sidewall spacers surrounding the first subset of the plurality of patterning mandrels.

12. The method of claim 11, further comprising:

removing the sidewall spacers surrounding the first subset of the plurality of patterning mandrels exposed by the second block mask; and removing the second block mask.

13. The method of claim 12, further comprising etching the hard mask stack, the nanosheet stack and at least a portion of the substrate to form the one or more fins of the first width below the first subset of the plurality of patterning mandrels and to form the one or more fins of the second width below the remaining sidewall spacers.

14. The method of claim 1, further comprising removing portions of the patterning layer exposed by the lithographic mask to form a plurality of patterning mandrels.

15. The method of claim 14, wherein the plurality of patterning mandrels comprises a first subset of patterning mandrels corresponding to the one or more first regions defined by the lithographic mask and a second subset of patterning mandrels corresponding to the one or more second regions defined by the lithographic mask.

16. The method of claim 14, wherein removing the portions of the patterning layer exposed by the lithographic mask to form the plurality of patterning mandrels comprises utilizing reactive-ion etching.

17. The method of claim 14, further comprising removing the lithographic mask following removal of the portions of the patterning layer exposed by the lithographic mask to form the plurality of patterning mandrels.

18. The method of claim 1, wherein the patterning layer comprises amorphous silicon.

19. The method of claim 1, wherein the patterning layer comprises amorphous carbon.

20. The method of claim 1, wherein the lithographic mask comprises a photoresist material.

* * * * *